(12) United States Patent
Koga

(10) Patent No.: US 7,535,757 B2
(45) Date of Patent: May 19, 2009

(54) MAGNETIC MEMORY

(75) Inventor: Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 98 days.

(21) Appl. No.: 11/905,741

(22) Filed: Oct. 3, 2007

(65) Prior Publication Data

US 2008/0094883 A1    Apr. 24, 2008

(30) Foreign Application Priority Data

Oct. 6, 2006    (JP) .......................... P2006-275497

(51) Int. Cl.
*G11C 11/14* (2006.01)
(52) U.S. Cl. ...................... 365/171; 365/158
(58) Field of Classification Search ................. 365/171, 365/158, 145
See application file for complete search history.

(56) References Cited

U.S. PATENT DOCUMENTS 6,844,204 B2 * 1/2005 Asao ............................ 438/3

6,879,515 B2 * 4/2005 Yoda et al. ................... 365/158

OTHER PUBLICATIONS

W.C. Jeong et al., "Highly scalable MRAM using field assisted current induced switching," *Symposium on VLSI Technology. Digest of Technical Papers*, 2005, pp. 184-185.

* cited by examiner

*Primary Examiner*—Vu A Le
(74) *Attorney, Agent, or Firm*—Oliff & Berridge, PLC

(57) ABSTRACT

To provide a magnetic memory capable of reducing the amount of write current, even when the element size is 0.7 μm or less. Each of storage areas has a transistor for read/write control, which is connected electrically to either one of the fixed layer and the free layer of each magneto-resistance effect element, a wiring that is electrically connected to the other one of the fixed layer and the free layer of each magneto-resistance effect element, and a magnetic yoke that surrounds the wiring and provides a magnetic field to the free layer, and the number of the transistors within each storage area is one.

10 Claims, 32 Drawing Sheets

Fig.4

| MTJ SIZE:L<br>μm | NO YOKE(B)<br>WRITE CURRENT : Iw<br>mA | PRESENT EMBODIMENT(A)<br>WRITE CURRENT : Iw<br>mA |
|---|---|---|
| 5 | 12 | |
| 3 | 11.5 | |
| 1 | 11 | 2.7 |
| 0.5 | 12 | 2 |
| 0.3 | | 0.75 |
| 0.1 | 17 | 0.2 |
| 0.07 | | 0.15 |

Fig.6

| MTJ RESISTANCE R | Ω | 500 | 1000 | 2000 | 3000 | 5000 |
|---|---|---|---|---|---|---|
| ALLOWABLE CURRENT Imax | mA | 2.5 | 1.8 | 1.1 | 0.7 | 0.2 |
| WRITE CURRENT Iw(Imax*0.6) | mA | 1.5 | 1.1 | 0.6 | 0.4 | 0.1 |
| READ CURRENT Is(Iw*0.1) | mA | 0.15 | 0.11 | 0.06 | 0.04 | 0.01 |
| AlOx_MR RATIO | % | 25 | 35 | 40 | 40 | 40 |
| MgO_MR RATIO | % | 60 | 175 | 200 | 230 | 230 |
| OUTPUT Vo | mV | 74 | 106 | 129 | 120 | 47 |
| $V_{AIox}$ | mV | 18 | 37 | 51 | 48 | 19 |
| $V_{Mgo}$ | mV | 44 | 185 | 257 | 276 | 108 |

MAGNETIC MEMORY

BACKGROUND OF THE INVENTION

1. Field of the Invention

The present invention relates to a magnetic memory.

2. Related Background Art

A MRAM (Magnetic Random Access Memory) has attracted attention as a non-volatile memory. The MRAM stores information by controlling a magnetization direction of a free layer (sensitive magnetic layer) with respect to a magnetization direction of a fixed layer, and reads the stored information by measuring the amount of electrons (electrical resistance) transmitting through the free layer. The amount of electrons transmitting through a memory element, i.e., the magnetic resistance, is changed by the difference between the magnetization directions of the free layer and the fixed layer, thus the value that is obtained when the magnetization directions of both layers are parallel and the magnetic resistance is low is set to, for example, "0," and the value that is obtained when the magnetization directions of both layers are antiparallel and the magnetic resistance is high is set to, for example, "1."

When writing information to each memory element, an electrical wire is disposed in the vicinity of the memory element, and the magnetization direction of the free layer is changed by means of a magnetic induction field generated by applying current to the electrical wire. Recently, there has been known a magnetic memory that writes information by injecting a spin to a free layer, while performing magnetic-field assistance (for example, see W. C. Jeong, J. H. Park, J. H. Oh, G. T. Jeong, H. S. Jeong, and Kinam Kim. "Highly scalable MRAM using field assisted current induced switching." Symposium on VLSI Technology Digest of Technical Papers (2005): P. 184-185).

Incidentally, high integration of the MRAM by miniaturizing each memory element has been studied. According to the "scaling law" of a semiconductor technology, high integration and electrical power saving can be achieved by reducing a certain element three-dimensionally and, at the same time, changing the impurity concentration and power supply voltage at the same rate.

It is considered that the abovementioned technical common knowledge of the semiconductor technology applies to a magnetic memory to a certain extent. That is, it is self-evident that a large external magnetic field (write current) is required to change the magnetization direction of an extremely large magnetic substance, and that a relatively small external magnetic field is sufficient to change the magnetization direction of a small magnetic substance. In other words, the amount of write current required to invert the magnetization of a free layer decreases by reducing the dimension of the element.

SUMMARY OF THE INVENTION

However, a phenomenon is observed in which the scaling law does not apply if the value of the element size becomes a certain value or lower. Specifically, if the element size is equal to or smaller than 0.7 µm, the amount of write current required to invert the magnetization of the free layer increases due to the small element size.

There present device was contrived in view of the above problem, and it is, therefore, an object of the present device to provide a magnetic memory that is capable of reducing the amount of write current even when the element size is 0.7 µm or smaller.

In order to achieve the above object, the magnetic memory according to the present device is a magnetic memory, which is configured by disposing therein a plurality of storage areas having magneto-resistance effect elements, wherein each of the magneto-resistance effect elements has an element size of 0.7 µm or smaller, the element being taken in a direction of an easy magnetization axis, and has a free layer composed of a ferromagnetic body, a fixed layer composed of a ferromagnetic body, and an intermediate nonmagnetic layer interposed between the free layer and the fixed layer, each of the storage areas has switch means for read/write control, which is electrically connected to either one of the fixed layer and the free layer of the each magneto-resistance effect element, a wiring that is electrically connected to the other one of the fixed layer and the free layer of the each magneto-resistance effect element, and a magnetic yoke that surrounds the wiring and applies a magnetic field to the free layer, and the number of the switch means within the each storage area is one. The switch means is preferably a transistor.

In this structure, even when the element size is 0.7 µm or smaller, the amount of write current required to invert the magnetization of the free layer can be reduced as the element size decreases. Since the magnetic memory can be operated even with weak write current, it is not necessary to provide a large-area transistor in addition to the transistor for reading. Therefore, it is only necessary to adopt only one switch means (transistor) for read/write control in each storage area, so that high integration can be achieved. Besides the transistor, a switch for controlling conduction in response to a mechanical or optical input can be used as the switch means.

It should be noted that an MRAM having a high MR ratio in each magneto-resistance effect elements is preferred in terms of the resolution of output voltage. The MR ratio increases as the element resistance increases, but when the intermediate nonmagnetic layer is composed of an insulation body, dielectric strength voltage decreases as the element resistance decreases. Specifically, it is necessary to reduce the amount of allowable current that can be caused to flow to each element. The write current has to be set smaller than the allowable current, with a margin. Therefore, the amount of write current has to be small in order to increase the MR ratio. For example, when the element resistance is 3000Ω, it is required that the amount of write current be 0.4 mA or less in order to prevent the occurrence of a dielectric breakdown. However, when the magnetic yoke is not used, the amount of write current becomes 10 mA or more, causing a dielectric breakdown in the intermediate nonmagnetic layer.

In the magnetic memory of the present device, the intermediate nonmagnetic layer of the each magneto-resistance effect element is composed of an insulation body, and the following relational expression is satisfied between the element size L and the resistance value R of the magneto-resistance effect element that is obtained when the magnetization directions of the fixed layer and the free layer are parallel to each other:

$$L \leq -0.3 \times \ln(R) + 3$$

In this case, the MR ratio can be improved without causing a dielectric breakdown in the intermediate nonmagnetic layer.

Furthermore, the abovementioned wiring has: a first wiring, which is connected at one end thereof to the other one of the fixed layer and the free layer and extends in one direction; a second wiring, which extends parallel to the first wiring on the inside of the magnetic yoke and is connected at one end thereof to a reference potential; and a connection wiring that detours around the outside of the magnetic yoke to electrically connect the other end of the first wiring to the other end of the second wiring.

In this case, since both the first wiring and the second wiring pass through the inside of the magnetic yoke, a magnetic field can be effectively provided to each magneto-resistance effect element. Also, since the first wiring, the connection wiring, and the second wiring are continuous, a magnetic field can be provided to each magneto-resistance effect element via the magnetic yoke simply by conducting these wirings, and the magneto-resistance effect element can be conducted.

Also, the first wiring, the connection wiring, and the second wiring are continuous in a spiral manner around a straight line that is parallel to a thickness direction of the magneto-resistance effect element.

Specifically, since these wirings are continuous in a spiral manner, the first wiring and the second wiring are not present within the same plane and thus are separated from each other in the thickness direction of the magneto-resistance effect element. The second wiring is separated from the magneto-resistance effect element, and the direction of a magnetic field generated around the second wiring becomes comparatively parallel with respect to the magnetization direction of the fixed layer. The first wiring is in contact with the magneto-resistance effect element and can be applied with read current.

The abovementioned wiring further has an extended wiring that continues to the one end of the second wiring and is connected to a reference wiring providing the reference potential, wherein directions of rotation of the first wiring, the connection wiring, and the second wiring that continuously extend in a spiral manner are preferably opposite to directions of rotation of the second wiring and the extended wiring.

Since the first wiring, the connection wiring, and the second wiring are continuous in a spiral manner, a magnetic field is generated in parallel to a central axis of the spiral by conducting the wirings, whereby the influence of the magnetic field is applied to the magnetic yoke. The directions of rotation of these spiral wirings are opposite to the directions of rotation of the second wiring and the extended wiring. A magnetic field is generated along a central axis of the rotation of the second wiring and the extended wiring, but the direction of this magnetic field is opposite to the direction of the magnetic field generated by the spiral wirings along the direction of the axis, and both magnetic fields assist the magnetic field generated around the second wiring.

Only one wiring may be provided in the magnetic yoke. Specifically, this wiring has a first wiring that is electrically connected at one end thereof to the other one of the fixed layer and the free layer, extends in one direction, and is connected at the other end thereof to a reference potential. The first wiring conducts the abovementioned other one in the magneto-resistance effect element and generates an external magnetic field so as to surround the direction of travel of the applied current, and this magnetic field is applied to the free layer of the magneto-resistance effect element via the magnetic yoke. By increasing the amount of current to be applied, the magnetization direction within the free layer is changed by the external magnetic field. When the amount of the current to be applied is small, the magnetization direction within the free layer does not change, but the applied current flows through the magneto-resistance effect element as read current.

Moreover, when only one wiring is provided, this wiring has: an extended wiring, which continues to one end of the first wiring and is connected to a reference wiring providing the reference potential; and a reference penetrating wiring that connects the extended wiring to the reference wiring along the thickness direction of the magneto-resistance effect element, and the first wiring and the extended wiring may be formed in a T or L shape. In this case, the maximum distance between the separated wirings formed in a T or L shape can be reduced, and the T-shaped or L-shaped wirings can be contained in a small storage area.

Furthermore, when only one wiring is provided, this wiring has: an extended wiring, which continues to the one end of the first wiring and is connected to a reference wiring providing the reference potential; and a reference penetrating wiring that connects the extended wiring to the reference wiring along the thickness direction of the magneto-resistance effect element, and the first wiring and the extended wiring may be formed in a U shape. The reference penetrating wiring extends from the extended wiring to the reference wiring. It is necessary to increase the total area of the reference penetrating wiring through which the current passes, in order to supply more current, and in this case the area of the extended wiring needs to be increased. When the first wiring and the extended wiring are in the shape of T, the extended wiring extends perpendicular to the first wiring, while when they are in the shape of U, the majority of the extended wiring extends parallel to the first wiring. Specifically, when increasing the area of the extended wiring, the length of the extended wiring is increased, but the first wiring and the extended wiring can be contained in a small space if the extended wiring extends parallel to the first wiring, thus a small storage area can be realized.

It is preferred that each of the storage areas have a vertical wiring for connecting the transistor to the magneto-resistance effect element along the thickness direction of the magneto-resistance effect element, and that the vertical wiring be provided in a plurality. In this case, since the number of the vertical wirings is plural, the total cross-sectional area of the vertical wiring through which the current passes can be increased, thus a large current can be caused to flow.

According to the magnetic memory of the present device, even when the element size of each memory element is 0.7 µm or less, the amount of write current can be reduced.

BRIEF DESCRIPTION OF THE DRAWINGS

FIG. 4 is a table showing the data of the graph shown in FIG. 3;

FIG. 6 is a table showing various measurement values;

DESCRIPTION OF THE PREFERRED EMBODIMENTS

Figure 1:
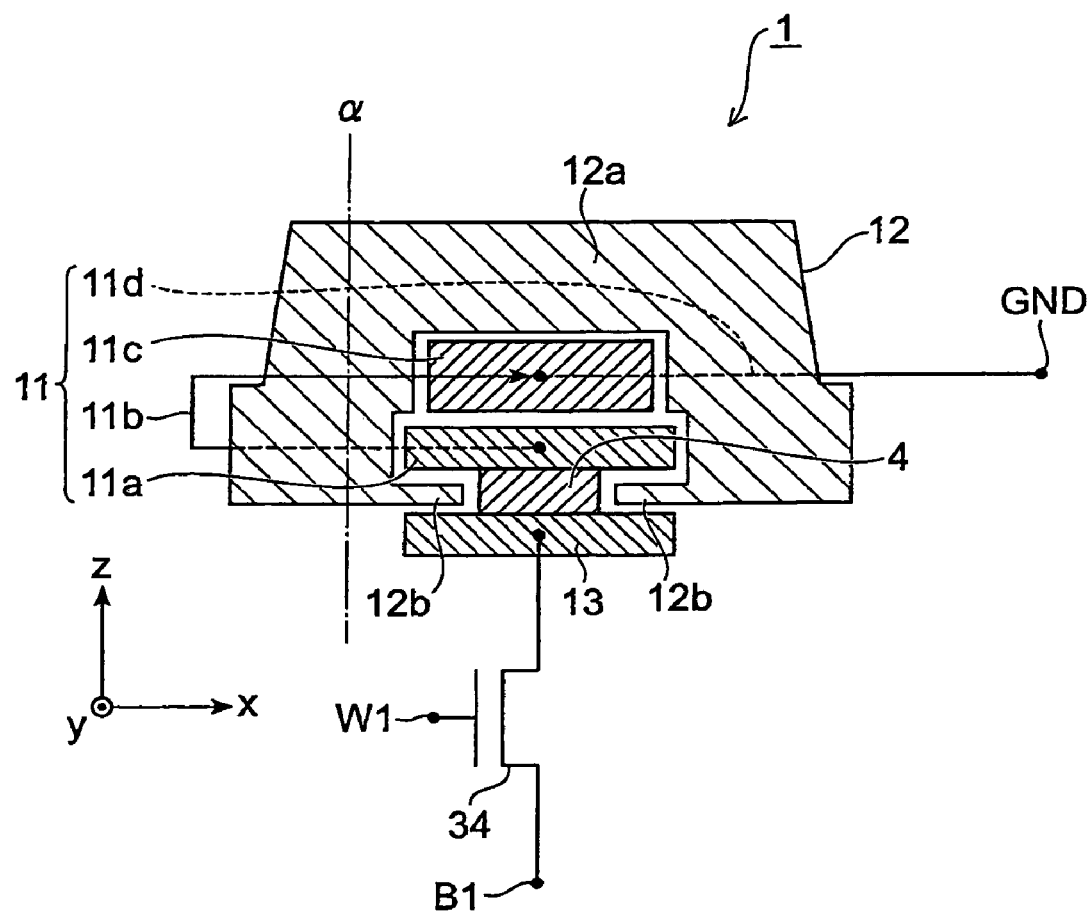
FIG. 1 is a diagram showing a cross-sectional structure of a memory element 1 of each storage area.

Hereinafter, the magnetic memory according to the embodiments is described. It should be noted that the same reference numerals are used to describe the same elements, and redundant explanations thereof are omitted.

The magnetic memory according to the embodiments has disposed therein a plurality of storage areas having magneto-resistance effect elements. A magnetic yoke is disposed around each magneto-resistance effect element to configure a memory element.

FIG. 1 is a diagram showing a cross-sectional structure of a memory element 1 of each storage area.

A magneto-resistance effect element 4 has an element size of 0.7 µm or less. The magneto-resistance effect element 4 has a free layer, a fixed layer composed of a ferromagnetic body, and an intermediate nonmagnetic layer interposed between the free layer and the fixed layer.

Each storage area has a transistor 34 for read/write control, which is electrically connected to either one of the fixed layer and the free layer of the magneto-resistance effect element 4.

Also, each storage area has a wiring 11 (11a) that is electrically connected to either one of the fixed layer and the free layer of each magneto-resistance effect element 4, and a magnetic yoke 12 that surrounds the wiring 11 and applies a magnetic field to the free layer. It should be noted that the number of transistors 34 within each storage area is one. A lower surface of the magneto-resistance effect element 4 is provided with a lower wiring 13, and the transistor 34 is connected to the magneto-resistance effect element 4 via the lower wiring 13. The magnetic yoke 12 is in the shape of a mountain with a concave portion extends along the wiring 11a, and has a main body portion 12a located closer to the wiring side than the free layer 44 (FIG. 2), and an adjacent portion 12b extending along an x direction from an end portion on the lower wiring 13 side of the main body portion 12a so as to reach the free layer 44 of the magneto-resistance effect element 4, wherein the adjacent portion 12b and the free layer 44 are slightly spaced apart from each other.

Once the transistor 34 is turned ON, current flows from a bit line B1 to the magneto-resistance effect element 4 via the lower wiring 13, and then the current flows to a reference potential GND through the wiring 11. In the case in which a potential of the bit line B1 is lower than the reference potential GND, the current flows backward.

When reading out information, the transistor 34 is turned ON, and read current (resistance) flowing to the magneto-resistance effect element 4 at this moment is measured. When writing the information, the potential of the bit line B1 is set higher than the reference potential GND, the transistor 34 is then turned ON, a magnetic field generated from the wiring 11 is applied to the free layer 44 through the magnetic yoke 12, and then the magnetization direction within the free layer 44 is changed so that it conforms to the applied magnetic field, whereby "0," for example, is written. If the potential of the bit line B1 is set lower than the reference potential GND and the transistor 34 is turned ON, a magnetic field in the opposite direction is generated from the wiring 11 and applied to the free layer 44 through the magnetic yoke 12, and the magnetization direction within the free layer 44 is changed so that it conforms to the applied magnetic field, whereby "1," for example, is written.

Furthermore, the wiring 11 has a first wiring 11a, which is connected at one end thereof to either one of the fixed layer and the free layer and which extends in one direction, a second wiring 11c, which extends parallel to the first wiring 11a on the inside of the magnetic yoke 12 and is connected at one end thereof to the reference potential GND, and a connection wiring 11b detours around the outside of the magnetic yoke 12 and electrically connects the other end of the first wiring 11a to the other end of the second wiring 11c. Since both the first wiring 11a and the second wiring 11c pass through the inside of the magnetic yoke 12, a magnetic field can be applied effectively to the magneto-resistance effect element 4.

Moreover, the first wiring 11a, the connection wiring 11b, and the second wiring 11c are continuous, a magnetic field can be applied to the magneto-resistance effect element 4 via the magnetic yoke 12 simply by conducting these wirings 11, and thereby the magneto-resistance effect element 4 can be conducted.

Moreover, the first wiring 11a, the connection wiring 11b, and the second wiring 11c are continuous in a spiral manner around a straight line α that is parallel to a thickness direction of the magneto-resistance effect element 4. Since the wirings 11 are continuous in a spiral manner, the first wiring 11a and the second wiring 11c are not present within the same plane and thus are separated from each other in the thickness direction of the magneto-resistance effect element 4. The second wiring 11c is separated from the magneto-resistance effect element 4, and the direction of a magnetic field generated around the second wiring 11c becomes comparatively parallel with respect to the magnetization direction of the fixed layer, whereby the magnetic field can be applied to the free layer comparatively effectively.

Figure 2:
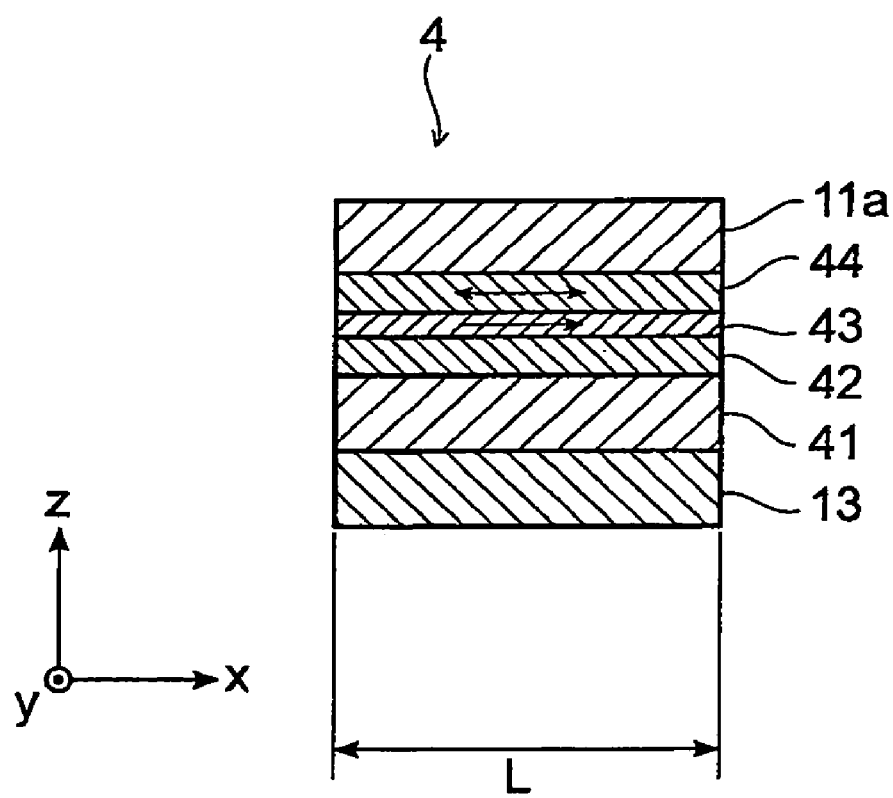
FIG. 2 is a vertical cross-sectional view of a magneto-resistance effect element (TMR element: Tunnel Magneto-Resistance) 4.

FIG. 2 is a vertical cross-sectional view of the magneto-resistance effect element (TMR element: Tunnel Magneto-Resistance) 4.

The TMR element 4 is a magneto-resistance effect element having the free layer 44 whose magnetization direction is changed by an external magnetic field generated by the current flowing through the wirings 11. Specifically, the TMR element 4 has a first magnetic layer (free layer) 44, which is a sensitive magnetic layer composed of a ferromagnetic body, second magnetic layers (fixed layers) 41, 42 whose magnetization directions are fixed, and an intermediate magnetic layer (insulating layer) 43 interposed between the free layer 44 and the fixed layers 41, 42. It should be noted that the fixed layers 41, 42 are constituted by a pinned layer 42 that is magnetized along the direction of an x-axis perpendicular to the thickness direction and is composed of a ferromagnetic body, and an antiferromagnetic layer 41 that is exchange-coupled to the pinned layer 42. The pinned layer 42 itself may also be referred to as a "fixed layer." On the surface of the free layer 44, which is opposite to the surface of the same on the nonmagnetic layer 43 side, there is provided the first wiring 11a configuring an upper electrode. It should be noted that the antiferromagnetic layer 41 is provided on the lower wiring 13 configuring a lower electrode.

The magnetization direction of the free layer 44 is basically parallel to the direction of the x-axis, and the resistance value between the free layer 44 and the ferromagnetic layers 41, 42 changes according to the relationship between the magnetization direction of the free layer 44 and the magnetization directions of the fixed layers 41, 42.

The length of the free layer 44 in the direction of the x-axis when the magnetization direction is oriented toward an easy magnetization direction is set as element size L.

The material of each of the layers is described.

The ferromagnetism that configures the free layer and the pinned layer 42 is the magnetism of a substance having adjacent spins aligned in the same direction and having a great magnetic moment as a whole, and has spontaneous magnetization even in the absence of an external magnetic field. Examples of such substance showing the ferromagnetism at room temperature include Fe, Co, Ni and Gd. Co, Ni—Fe alloy, or Co—Fe alloy can be suitably used as the ferromagnetic body.

FeMn, IrMn, PtMn, NiMn or the like can be applied as an antiferromagnetic body configuring the antiferromagnetic layer 41.

The intermediate nonmagnetic layer 43 is a nonmagnetic layer that configures, in cooperation with the fixed layer, a spin filter having permeable selectivity of spins. MgO, $Al_2O_3$, TiO, or other tunnel barrier layer that is thick enough to generate a tunnel effect, or a conductive layer, such as Cu, can be suitably applied as the intermediate nonmagnetic layer 43.

Figure 3:
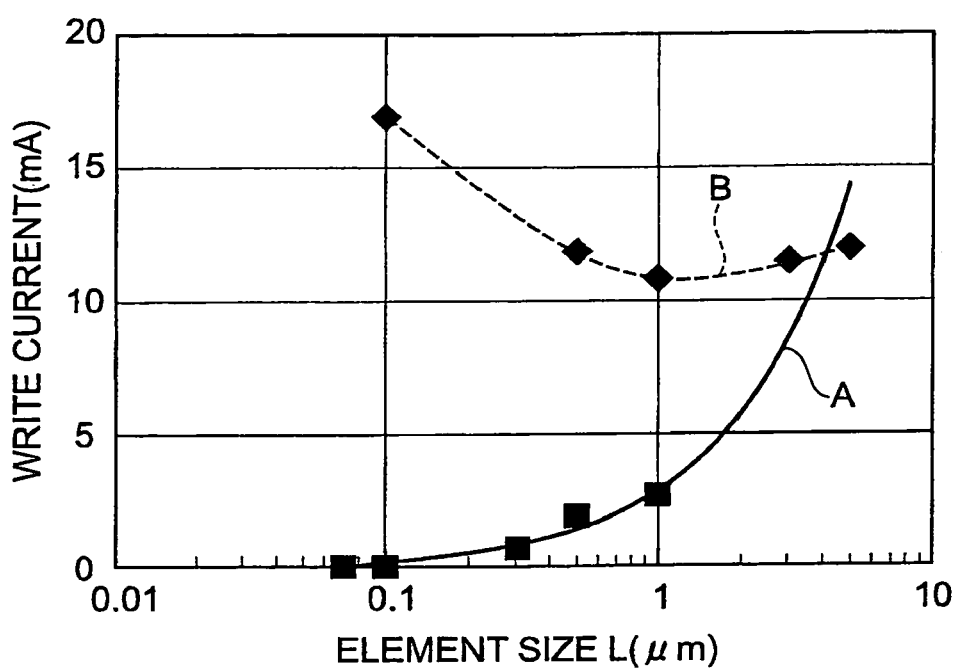
FIG. 3 is a graph showing a relationship between element size L and write current (mA)

FIG. 3 is a graph showing a relationship between the element size L and the write current (mA).

In the graph, the square marks represent the characteristics of the abovementioned memory element that uses the magnetic yoke (A), and the diamond marks represent the characteristics of the memory element that does not use the magnetic yoke (B).

As the characteristics (A) show, in the abovementioned structure where the magnetic yoke is used, even when the element size L is 0.7 μm or less, the amount of write current required to invert the magnetization of the free layer decreases as the element size L decreases. On the other hand, as the characteristics (B) show, in the structure where the magnetic yoke is not used, when the element size L is 0.7 μM or less, the amount of write current required to invert the magnetization of the free layer drastically increases as the element size L decreases.

Since the memory element of the present embodiment is operated even with weak write current, it is not necessary to provide a large-area transistor in addition to the transistor for reading. Therefore, it is only necessary to adopt only one transistor 34 for read/write control in each storage area, so that high integration can be achieved. In the case in which the element size L is 0.1 μm or less, the write current can be set to 3 mA or less. This amount is ⅕ of the write current shown in the characteristics (B) of a conventional structure. The data of the graph of FIG. 3 are shown in FIG. 4.

A test was conducted to evaluate how much current I (mA) can be supplied to the magneto-resistance effect element 4.

Figure 5:
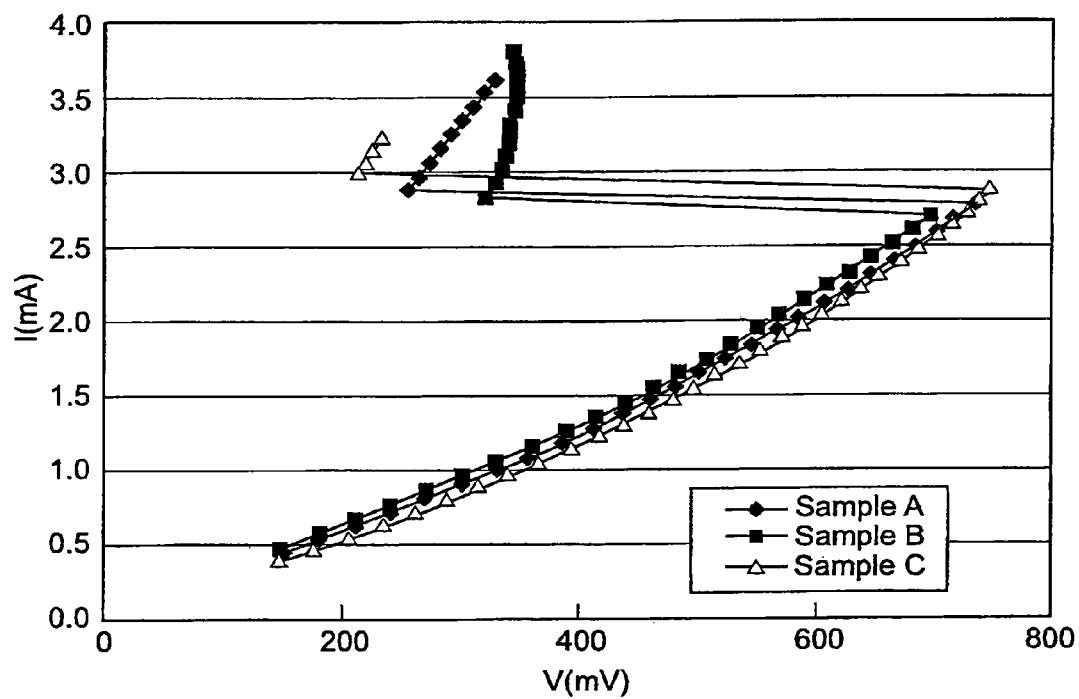
FIG. 5 is a graph showing a relationship between voltage V applied to the magneto-resistance effect element 4 (mV) and current I flowing therethrough (mA)

FIG. 5 is a graph showing a relationship between voltage V applied to the magneto-resistance effect element 4 (mV) and the current I flowing therethrough (mA). The magnetization directions of the free layer and fixed layer are parallel to each other, and the value of the resistance R, the MR ratio, the area of the free layer, and surface resistance at this moment were 430Ω, 25%, 0.0091 μm², and 3.9 Ω·μm², respectively. $Al_2O_3$ was employed as the intermediate magnetic layer. In any of the samples, the amount of current I increases as the amount of voltage V increases, but a dielectric breakdown occurs and the amount of voltage V decreases drastically once the amount of voltage V exceeds 700 mV. As a result, it was discovered that the upper limit of the amount of current that can be supplied (allowable current) is approximately 2.5 mA.

FIG. 6 is a table showing a relationship among the resistance R, the allowable current Imax, the write current Iw (=Imax×0.6), the read current Is (=Iw×0.1), the MR ratio obtained when an aluminum oxide film (AlOx) is used as the intermediate nonmagnetic layer, the MR ratio obtained when a magnesium oxide film (MgO) is used as the intermediate nonmagnetic layer, output voltage V0 (=Is×R) obtained when the abovementioned magnetization directions are parallel to each other, output voltage $V_{AlOx}$ (=Is×R×MR ratio) obtained when the abovementioned magnetization directions are anti-parallel and AlOx is used, and output voltage $V_{MgO}$ (=Is×R× MR ratio) obtained when the abovementioned magnetization directions are antiparallel and MgO is used.

It is understood that the MR ratio obtained when MgO is used is higher than the MR ratio obtained when AlOx is used. Also, the higher the resistance R, the higher the MR ratio. The MRAM having a high MR ratio in each magneto-resistance effect element is preferred in terms of the resolution of the output voltage. The MR ratio increases as the element resistance R increases, but when the intermediate nonmagnetic layer is composed of an insulation body, dielectric strength voltage decreases as the element resistance increases. Specifically, it is necessary to reduce the amount of allowable current Imax that can be caused to flow to each element. The write current Iw has to be set smaller than the allowable current Imax, with a margin. Therefore, the amount of write current Iw has to be small in order to increase the MR ratio.

Figure 7:
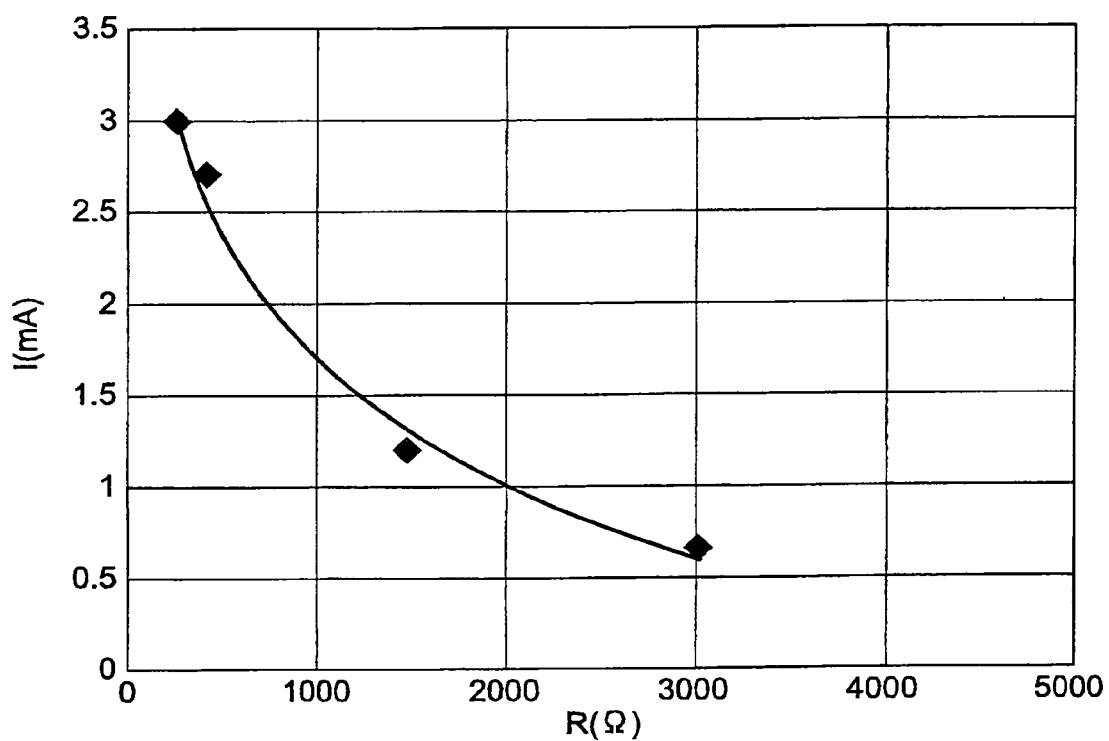
FIG. 7 is a graph showing a relationship between a resistance R (Ω) and the current I (mA)

FIG. 7 is a graph showing an example of a relationship between the resistance R (Ω) and the current I (mA).

The allowable current Imax, the write current Iw, and the read current Is decrease as the resistance R increases. Allowable current Imax=−1.0×ln(R)+8.8 is established. For example, in the case in which the element resistance is 3000Ω, the allowable current Imax needs to be 0.67 mA and the write current needs to be 0.4 mA or less with a margin in order to prevent the occurrence of a dielectric breakdown. However, when the magnetic yoke is not used, the write current becomes larger than 10 mA as shown in FIG. 3, causing a dielectric breakdown in the intermediate nonmagnetic layer.

In the magnetic memory of the present embodiment, the intermediate nonmagnetic layer 43 of each magneto-resistance effect element 4 is composed of an insulation body, and the following relational expression is satisfied between the element size L (μm) and the resistance value R (Ω) of the magneto-resistance effect element that is obtained when the magnetization directions of the fixed layer and the free layer are parallel to each other:

$$L \leq -0.3 \times \ln(R) + 3$$

When the element size L is 1 μm or less as indicated by (A) shown in FIG. 3, the write current Iw of the magneto-resistance effect element of the present embodiment is approximately provided by the following equation:

$$Iw = 2.9 \times L$$

On the other hand, the upper limit value of the write current Iw is limited by the following equation, as described above:

$$Iw = -1.0 \times \ln(R) + 8.8$$

Therefore, according to the two equations above, the relationship between the magneto-resistance effect element size and the resistance is expressed as $L \leq -0.34 \times \ln(R) + 3.03$, and the numbers in this equation are rounded off to one decimal place to express the abovementioned relationship as shown in the following equation:

$$L \leq -0.3 \times \ln(R) + 3$$

The values of R (Ω) and L (μm) in $L = -0.3 \times \ln(R) + 3$ are as follows.

TABLE 1

| R (Ω) | L (μm) |
|---|---|
| 100 | 1.62 |
| 300 | 1.29 |
| 500 | 1.14 |
| 1000 | 0.93 |
| 5000 | 0.44 |
| 6000 | 0.39 |
| 10000 | 0.24 |

Figure 8:
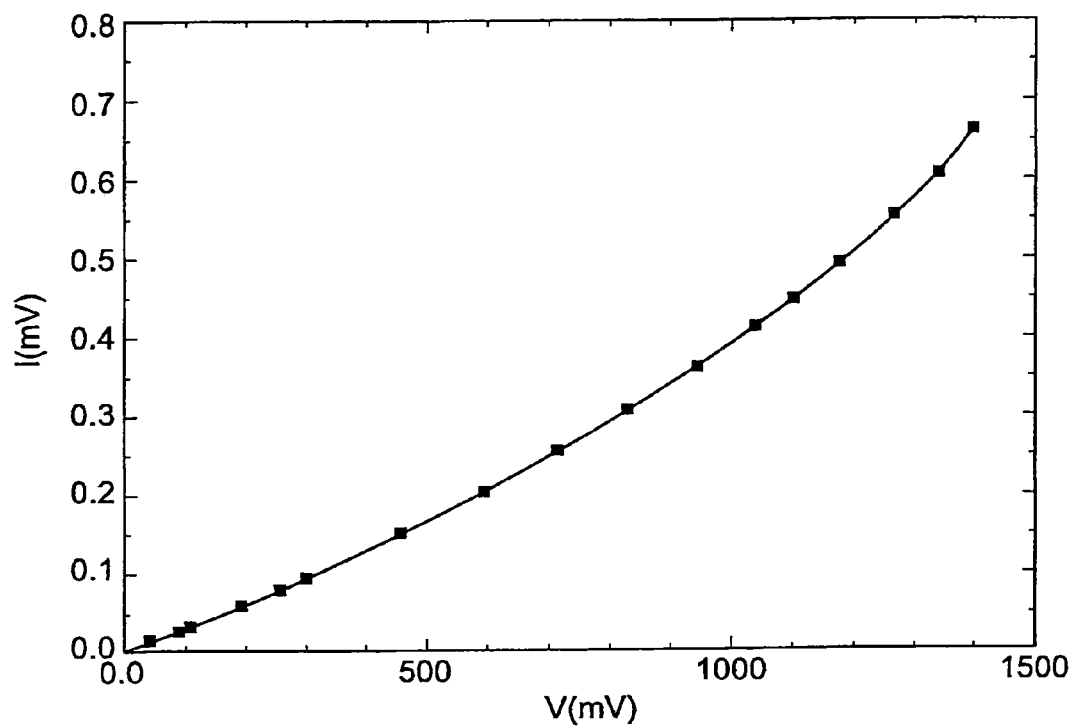
FIG. 8 is a graph showing an example of a relationship between the voltage V (mV) and current I (mV) of the TMR element when AlOx is used as an intermediate nonmagnetic layer.

In this case, the MR ratio can be improved without causing a dielectric breakdown in the intermediate nonmagnetic layer 43. FIG. 8 is a graph showing an example of a relationship between the voltage V (mV) and current I (mV) of the TMR element when AlOx is used as the intermediate nonmagnetic layer. The resistance R is 3000Ω, and the amount of current increases as the amount of voltage increases, until the current I reaches 0.7 mA, which is the allowable current Imax.

Next, the structure of the magnetic memory having a plurality of the abovementioned memory elements is described.

Figure 9:
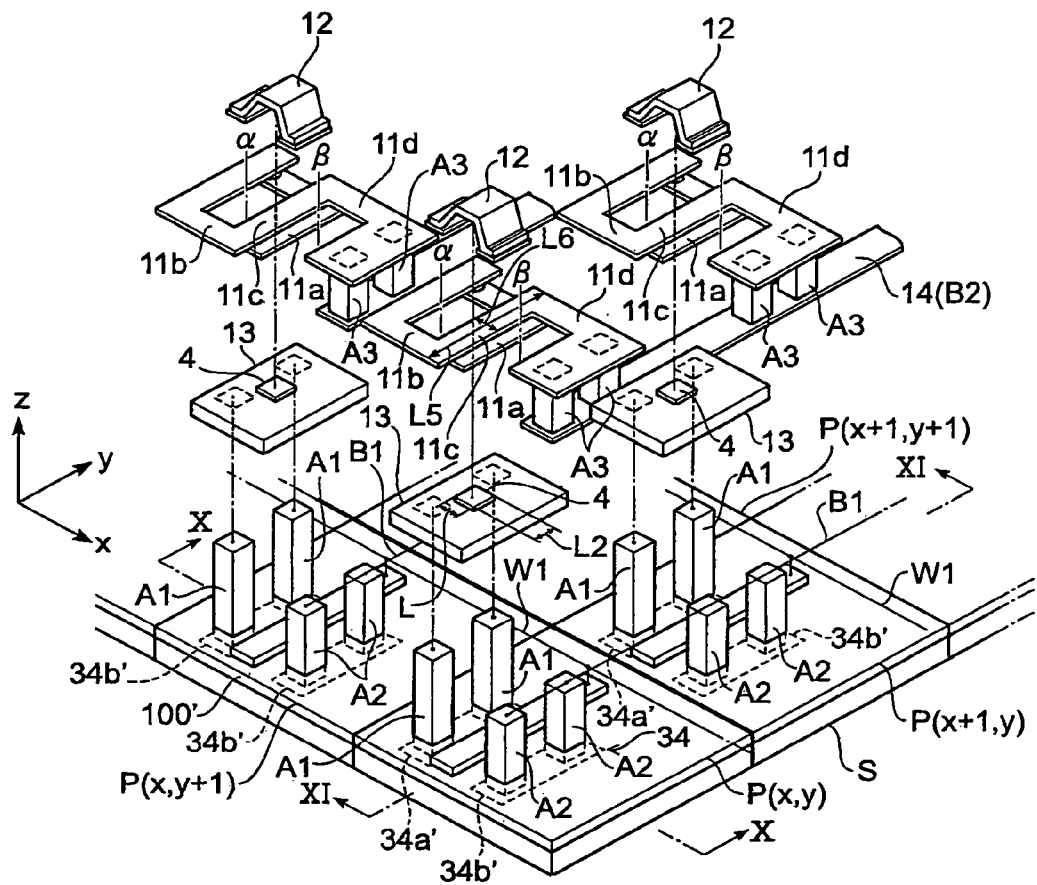
FIG. 9 is an exploded perspective view of a magnetic memory.

FIG. 9 is an exploded perspective view of the magnetic memory. A plurality of storage areas P (x, y), P (x+1, y), P (x, y+1), and P (x+1, y+1) having the same structure are arranged two-dimensionally. As with the free layer, the magnetic yoke 12 composed of a soft-magnetic ferromagnetic body stores therein the first wiring 11a and the second wiring 11c. The length of the free layer in the x direction in the magneto-resistance effect element 4 is represented as L, and the length of the same in a y direction is represented as L2. Here, L>L2 is established, and single-domaining of the free layer is promoted.

Figure 10:
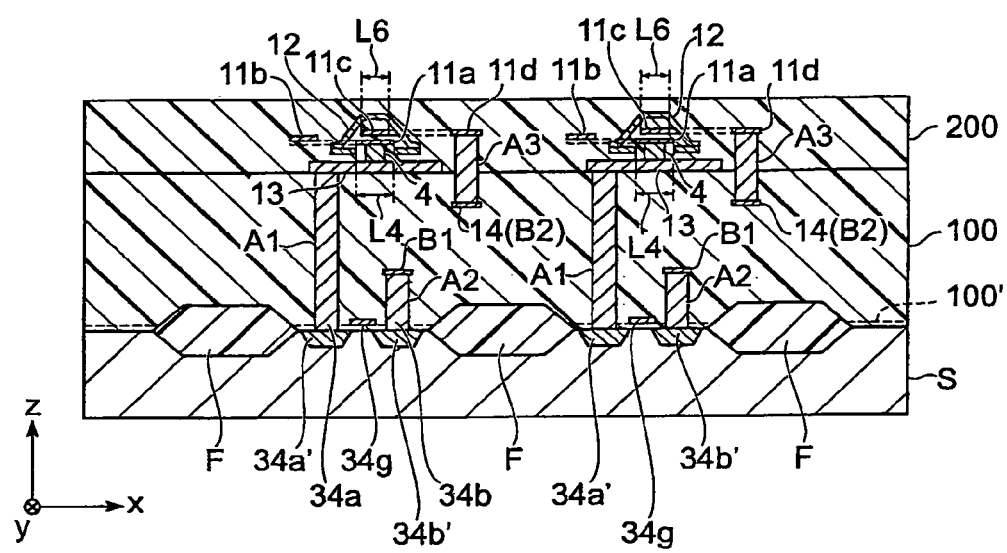
FIG. 10 is a cross-sectional view taken along an arrow X-X of the magnetic memory shown in FIG. 9.
Figure 11:
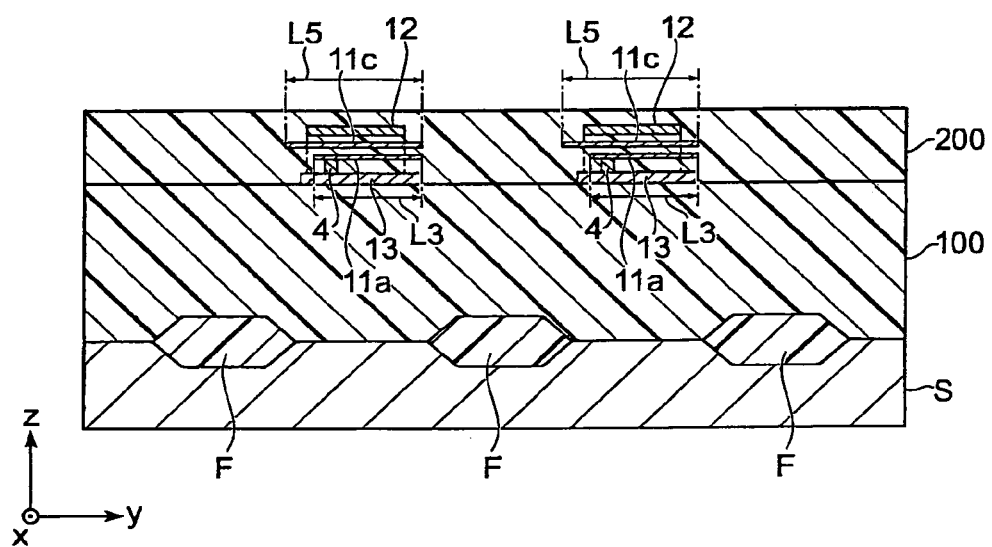
FIG. 11 is a cross-sectional view taken along an arrow XI-XI of the magnetic memory shown in FIG. 9.

FIG. 10 is a cross-sectional view taken along an arrow X-X of the magnetic memory shown in FIG. 9, and FIG. 11 is a cross-sectional view taken along an arrow XI-XI of the magnetic memory shown in FIG. 9.

In addition to the first wiring 11a that is connected at one end thereof to the magneto-resistance effect element 4, the second wiring 11c extending on the inside of the magnetic yoke 12, and the connection wiring 11b that electrically connects the other end of the first wiring 11a to the other end of the second wiring 11c, the wiring 11 has an extended wiring 11d that continues to one end of the second wiring 11c and is connected to a reference wiring 14 (bit line B2) that applies the reference potential GND.

Although the first wiring 11a, the connection wiring, 11b, and the second wiring 11c described above extend in a spiral manner, the direction of rotation of each of the wirings is opposite to the directions of rotation of the second wiring 11c and the extended wiring 11d. The directions of rotation are based on current flowing through each wiring in one direction. Since the first wiring 11a, the connection wiring 11b and the second wiring 11c are continuous in a spiral manner, a magnetic field is generated in parallel to the central axis α of the spiral by conducting the wirings 11, whereby the influence of the magnetic field is applied to the magnetic yoke 12. The directions of rotation of these spiral wirings are opposite to the directions of rotation of the second wiring 11c and the extended wiring 11d. A magnetic field is generated along a central axis β of the rotation of the second wiring 11c and the extended wiring 11d, but the direction of this magnetic field is opposite to the direction of the magnetic field generated by the spiral wirings along the direction of the axis α, and both magnetic fields assist the magnetic field H generated around the second wiring 11c.

The lower wiring 13 configuring the lower electrode is connected to a source or drain electrode 34a of the transistor 34 via a plurality of vertical wirings A1 penetrating an insulating layer 100, which is formed on a semiconductor substrate S, in a thickness direction of the insulating layer 100. The vertical wirings A1 are wirings that penetrate from a surface of the semiconductor substrate S to the lower insulating layer 100. The semiconductor substrate S is made of, for example, Si, and a conductive impurity different from the semiconductor substrate is added to a source region or a drain region. The lower insulating layer 100 is made of $SiO_2$ or the like, and a surface of the lower insulating layer 100 on the semiconductor substrate side configures a gate oxide film 100'.

In each of the storage areas P (x, y), the number of vertical wirings A1 connecting the transistor 34 and the magneto-resistance effect element 4 to each other along the thickness direction (z direction) of the magneto-resistance effect element 4 is plural. In this case, since the number of the vertical wirings A1 is plural, the total cross-sectional area of the vertical wirings A1 through which the current passes can be increased, thus large current can be caused to flow.

In this example, it is assumed that the vertical wirings A1 are connected to the drain electrode 34a. A gate electrode 34g of the transistor 34 is electrically connected to a word wiring W1. The transistor 34 is constituted by the drain electrode 34a, a source electrode 34b, the gate electrode 34g, a drain region 34a' and a source region 34b' that are formed immediately below the source electrode 34b, wherein the drain electrode 34a and the source electrode 34b are connected in accordance with a potential of the gate electrode 34g. The source electrode 34b is connected to the bit line B1.

It should be noted that the bit lines B1, B2, and the word wiring W1 are embedded in the lower insulating layer 100 formed on the semiconductor substrate S, and an upper insulating layer 200 is formed on the lower insulating layer 100. Furthermore, a plurality of wirings are provided inside the lower insulating layer 100 according to need. The source electrode 34b and the bit line B1 are connected to each other by a plurality of vertical wirings A2. Moreover, the transistor 34 is formed on the inside of a field oxide film F.

In addition, the extended wiring 11d is connected to the reference wiring 14 (bit line B2) embedded in the lower insulating layer 100, via a plurality of reference penetrating wirings A3. The reference penetrating wirings A3 penetrate the upper insulating layer 200 to reach the inside of the lower insulating layer 100, and connect the extended wiring 11d and the reference wiring 14 to each other along the thickness direction of the magneto-resistance effect element 4.

The length of the first wiring 11a in the y direction is represented as L3, the length of the same in the x direction is represented as L4, the length of the second wiring 11c in the y direction is represented as L5, and the length of the same in the x direction is represented as L6. Here, L5>L3 is established, and, since the length L5 of the second wiring 11c generating mainly a magnetic field for writing is longer than the length L3 of the first wiring 11a, a magnetic field can be applied uniformly to the magneto-resistance effect element 4. Particularly, the second wiring 11c positioned in an upper section is located closer to an end surface side in −y direction of the magnetic yoke 12 than the first wiring 11a, thus there are effects that the magnetic field generated by current can be transmitted efficiently to the magnetic yoke 12 and the amount of write current can be reduced. Moreover, L4>L6 is established, and the width L4 of the first wiring 11a is wider than the width L6 of the second wiring 11c generating mainly a magnetic field for writing, thus there are effects that the wirings can be manufactured easily and the height of the magnetic yoke 12 can be reduced by thinning the wiring layers, whereby the magnetic field can be applied efficiently.

Figure 12:
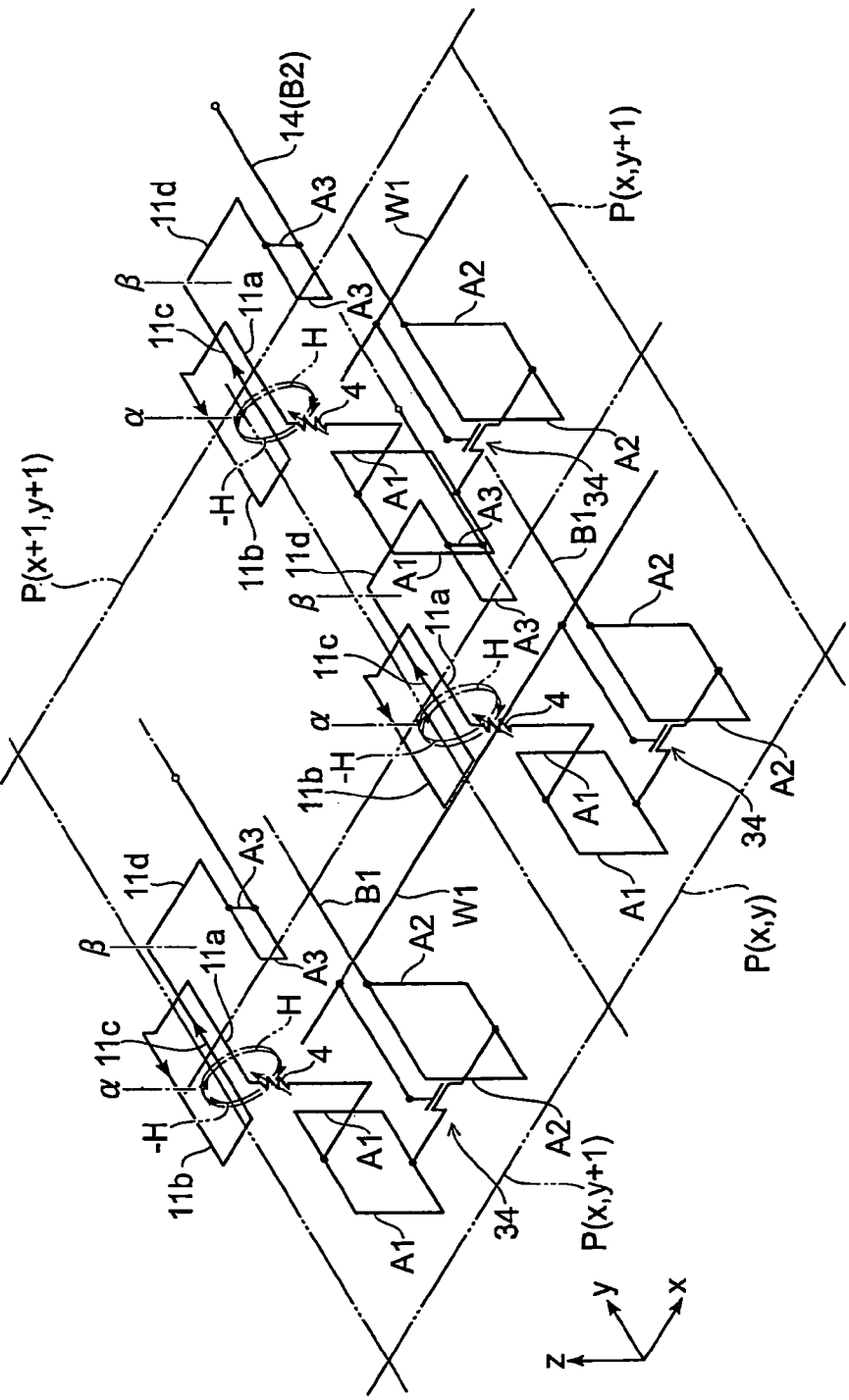
FIG. 12 is a circuit diagram showing an electrical connection relationship in the magnetic memory shown in FIG. 9.
Figure 13:
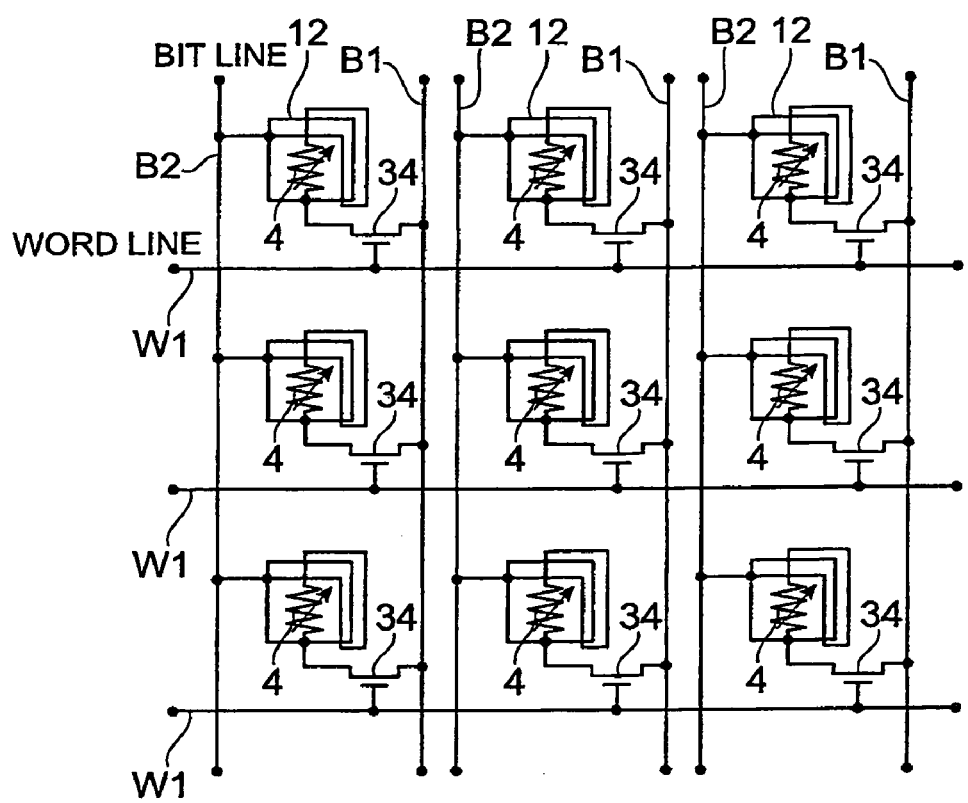
FIG. 13 is a circuit diagram showing a simplified version of the connection relationship shown in FIG. 12.

FIG. 12 is a circuit diagram showing an electrical connection relationship in the magnetic memory shown in FIG. 9. FIG. 13 is a circuit diagram showing a simplified version of the connection relationship shown in FIG. 12.

When reading out information, the potential of the bit line B1 is set higher than the reference potential GND provided by the bit line B2, the transistor 34 is turned ON, and read current (resistance) flowing through the magneto-resistance effect element 4 at this moment is measured. In the case in which the magnetization directions of the free layer and the fixed layer in the magneto-resistance effect element 4 are parallel to each other and the magnetic resistance is low, "0," for example, is set, and in the case in which the magnetization directions of both layers are antiparallel and the magnetic resistance is high, "1," for example, is set. In this manner, the first wiring 11a is in contact with the magneto-resistance effect element 4, whereby the read current can be caused to flow.

When writing the information, and when writing, for example, "0," the potential of the bit line B1 is set higher than the reference potential GND provided by the bit line B2, the transistor 34 is turned ON, and a magnetic field H, which is generated by the current flowing through the first wiring 11a so as to surround the direction of travel of the current (y direction) in a predetermined section, and a magnetic field H, which is generated by the current flowing through the second wiring 11c so as to surround the direction of travel of the current in a predetermined direction, pass through the inside of the magnetic yoke 12 and are then applied to the free layer 44 of the magneto-resistance effect element 4 (see FIG. 2). Accordingly, the magnetization direction within the free layer 44 changes so that it conforms to the applied magnetic fields, whereby "0" is written. The magnetization directions of the fixed layers 41, 42 are perpendicular to the direction in which the first wiring 11a extends in the thickness direction of the magneto-resistance effect element 4 (x direction).

When writing the information, and when writing, for example, "1," the potential of the bit line B1 is set lower than the reference potential GND of the bit line B2, the transistor 34 is turned ON, and a magnetic field (−H), which is generated by the current flowing through the first wiring 11a so as to surround the direction of travel of the current in a direction opposite to the predetermined direction, and a magnetic field (−H), which is generated by the current flowing through the second wiring 11c so as to surround the direction of travel of the current in a direction opposite to the predetermined direction, pass through the inside of the magnetic yoke 12 and are then applied to the free layer of the magneto-resistance effect element 4. Accordingly, the magnetization direction within the free layer changes so that it conforms to the applied magnetic fields, whereby "1" is written.

Figure 14:
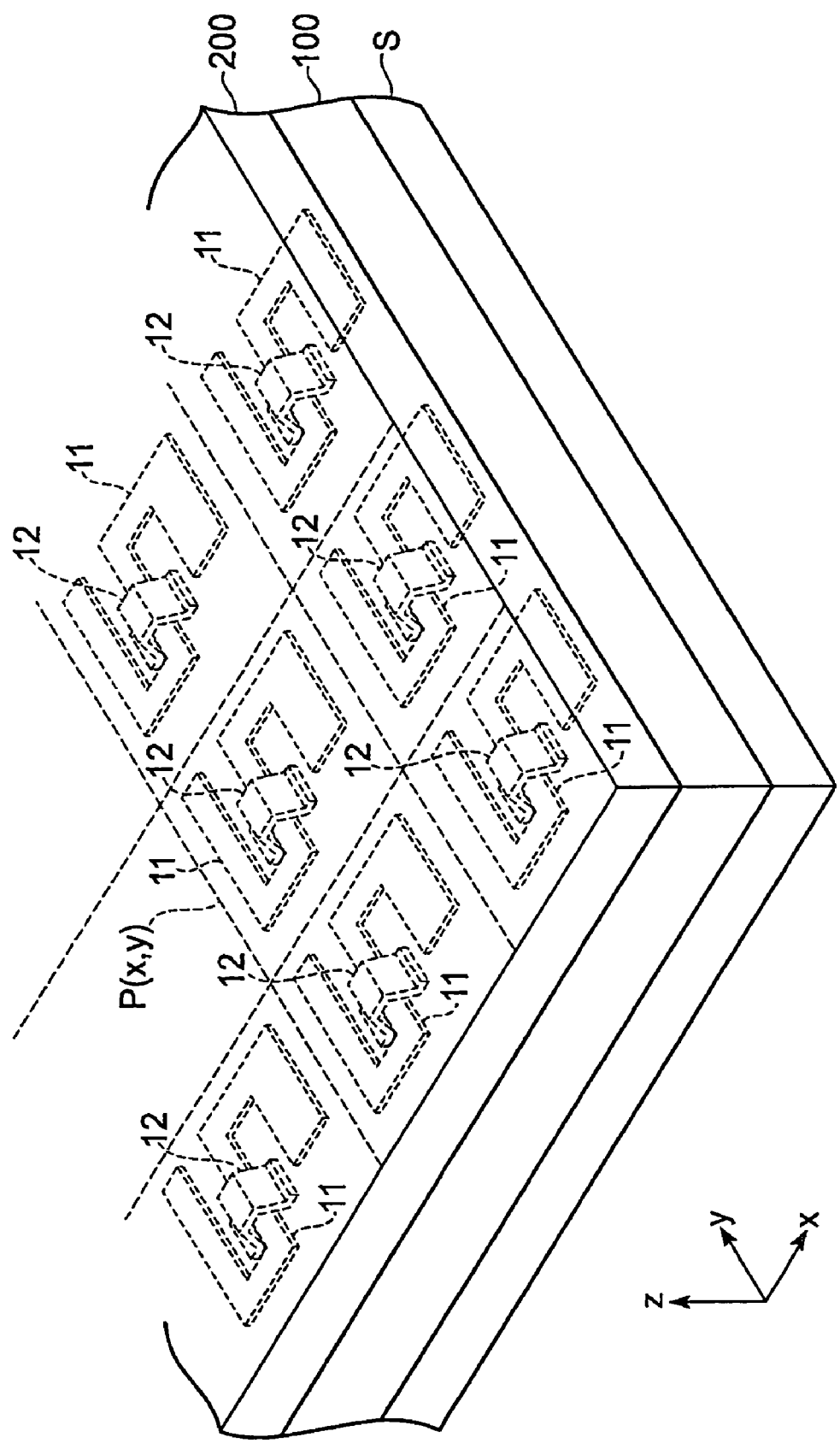
FIG. 14 is a perspective view of the magnetic memory.

FIG. 14 is a perspective view of the magnetic memory.

This magnetic memory has the lower insulating layer 100 formed on the semiconductor substrate S, and the upper insulating layer 200, and the magnetic yoke 12 and the wirings 11 in each storage area P (x, y) are embedded in the upper insulating layer 200. Resin, $SiO_2$, or the like can be used as the material of the upper insulating layer. The transistor 34 shown in FIG. 10 is positioned within an area in which the magnetic yoke 12 is projected in the thickness direction (z direction), and the size of each storage area P (x, y) is reduced extremely small.

Figure 15:
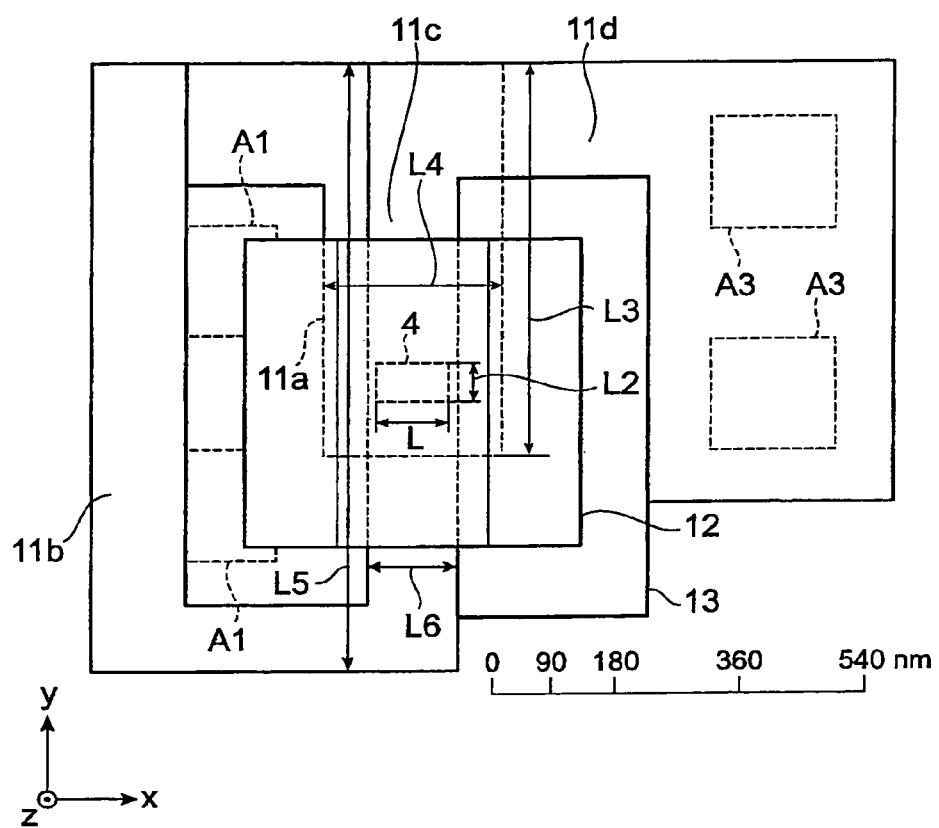
FIG. 15 is a plan view of a single memory element according to an embodiment.

FIG. 15 is a plan view of a single memory element according to the embodiment described above.

The length L of the magneto-resistance effect element 4 in the x direction is 180 nm (0.18 μm), and the length L2 of the same in the y direction is 90 nm. The lengths of each vertical wiring A1 and each reference penetrating wiring A3 in the x direction are 180 nm, and the lengths of the same in the y direction are 180 nm. Also, L3=600 nm, L4=265 nm, L5=940 nm, and L6=130 nm. In this element, Iw can be set to 1.0 mA.

Figure 16:
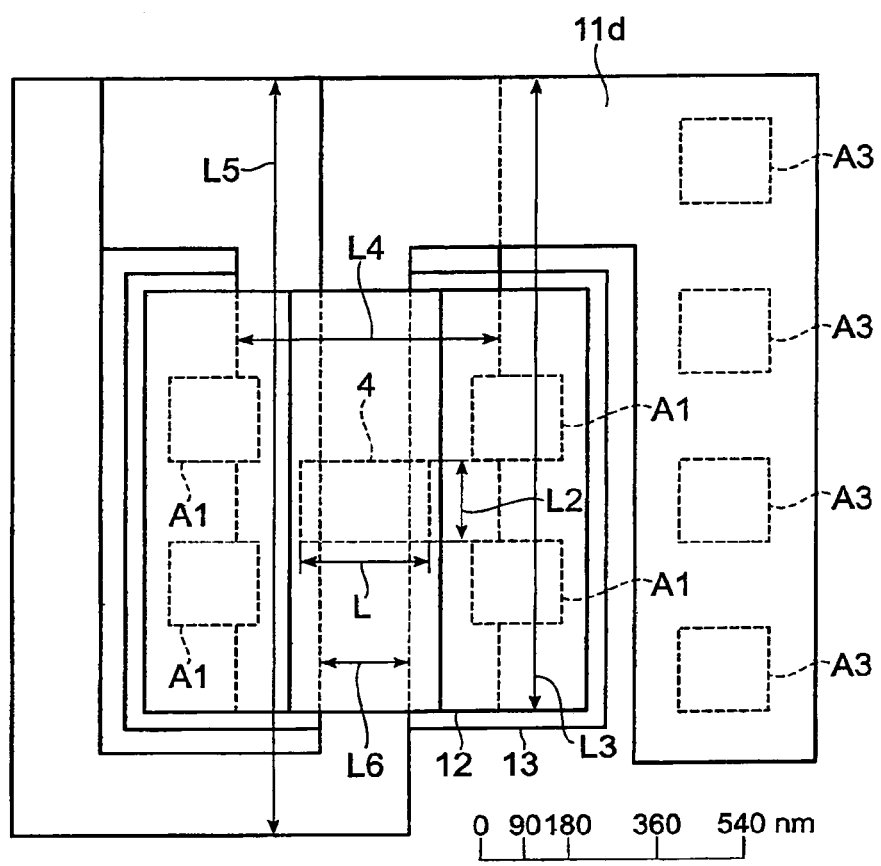
FIG. 16 is a plan view of a memory element according to a modified example of the memory element shown in FIG. 15.

FIG. 16 is a plan view of a memory element according to a modified example of the memory element shown in FIG. 15.

The length L of the magneto-resistance effect element 4 in the x direction is 300 nm (0.3 μm), and the length L2 of the same in the y direction is 200 nm. The length of each vertical wiring A1 and of each reference penetrating wiring A3 in the x direction is 180 nm, and the length of the same in the y direction is 180 nm, but the values thereof are different from those shown in FIG. 15. In this example, four vertical wirings A1 extending from a lower surface of the lower wiring 13 to the transistor 34 are provided, and four reference penetrating wirings A3 extending from the extended wiring 11d to the reference wiring 14 are provided. The rest of the configuration is the same as above. Furthermore, L3=1360 nm, L4=530 nm, L5=1720 nm, and L6=175 nm. In this element, Iw can be set to 2.0 mA.

It should be noted in the above-described example that two wirings are present within the magnetic yoke 12, but only one wiring may be provided within the magnetic yoke 12.

Figure 17:
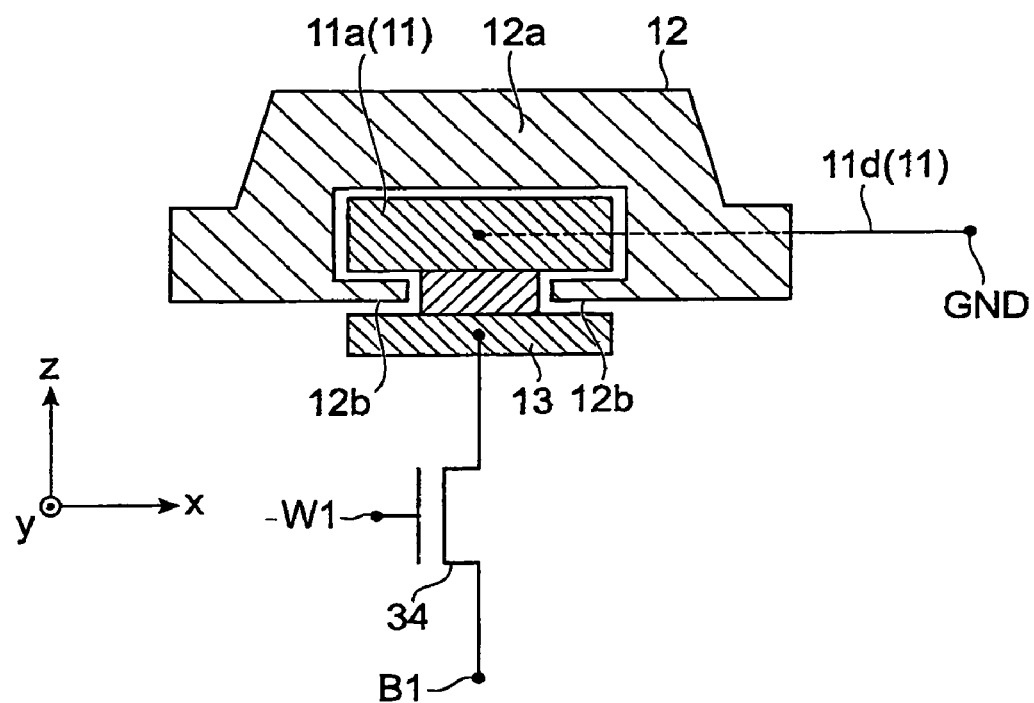
FIG. 17 is a diagram showing a cross-sectional structure of the memory element 1 in each storage area.
Figure 18:
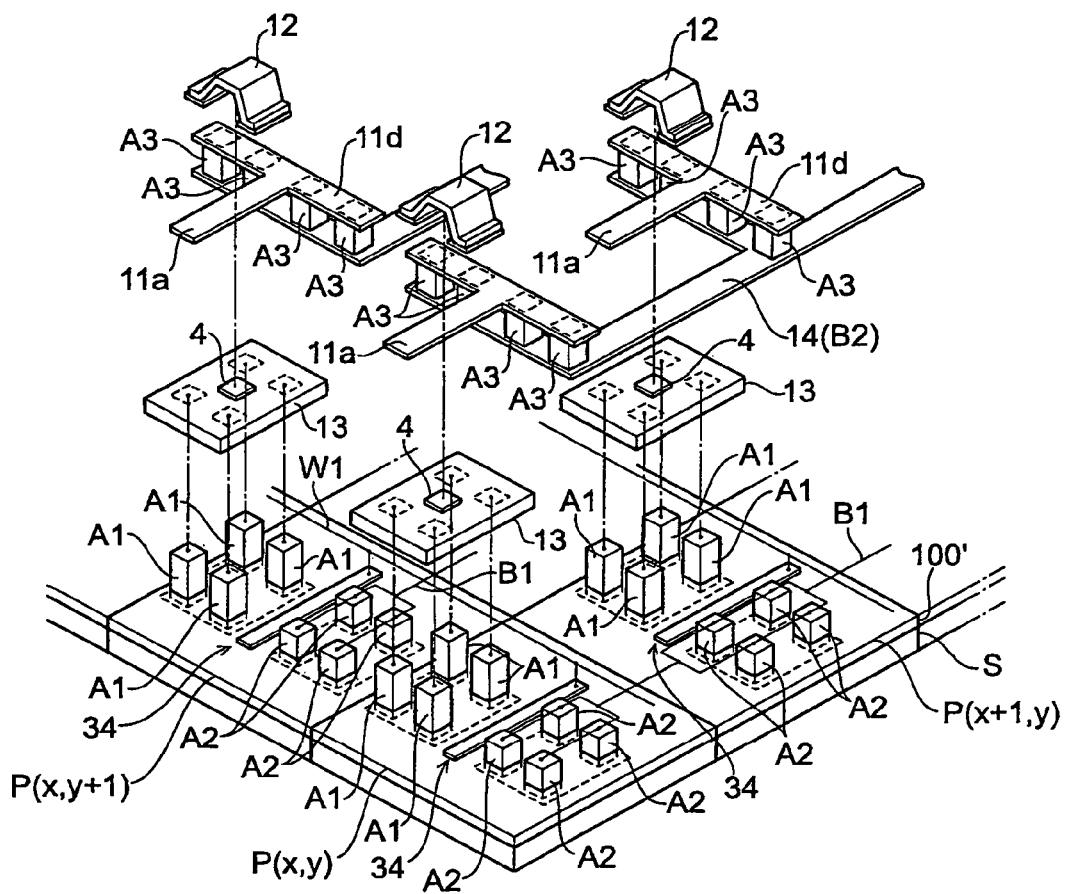
FIG. 18 is an exploded perspective view of the magnetic memory.

FIG. 17 is a diagram showing a cross-sectional structure of the memory element 1 in each storage area in the case described above. FIG. 18 is an exploded perspective view of this magnetic memory. The plurality of storage areas P (x, y), P (x+1, y), P (x, y+1), and P (x+1, y+1) having the same structure are arranged two-dimensionally.

The wiring 11 has, on the inside of the magnetic yoke 12, only the first wiring 11a (11), which is electrically connected at one end thereof to the other one of the fixed layer and the free layer, extends in one direction, and is connected at the other end thereof to the reference potential GND. The first wiring 11a conducts the abovementioned other one in the magneto-resistance effect element 4 and generates an external magnetic field so as to surround the direction of travel of the applied current (y direction), and this magnetic field is applied to the free layer 44 (see FIG. 2) of the magneto-resistance effect element 4 via the magnetic yoke 12. By increasing the amount of current to be applied, the magnetization direction within the free layer 44 (see FIG. 2) is changed by the external magnetic field. When the amount of the current to be applied is small, the magnetization direction within the free layer does not change, but the applied current flows through the magneto-resistance effect element 4 as the read current.

Furthermore, in the case in which only one wiring 11 is provided within the magnetic yoke 12, this wiring 11 further has the extended wiring 11d, which continues to one end of the first wiring 11a and is connected to the reference wiring 14 providing the reference potential GND, and a plurality of reference penetrating wirings A3 that connect the extended wiring 11d and the reference wiring 14 to each other along the thickness direction of the magneto-resistance effect element 4 (z direction), wherein the first wiring 11a and the extended wiring 11d are formed in a T shape. The number of vertical wirings A1 and A2 is set to four in each storage area P (x, y). The first wiring 11a and the extended wiring 11d are formed in an L shape.

The rest of configuration is the same as that sown in FIG. 1 and FIG. 9.

In the case of this example, the maximum distance between the wirings 11 formed in a T shape on the x and y planes can be reduced, and the T-shaped wirings 11 can be contained in the small storage area P (x, y).

Figure 19:
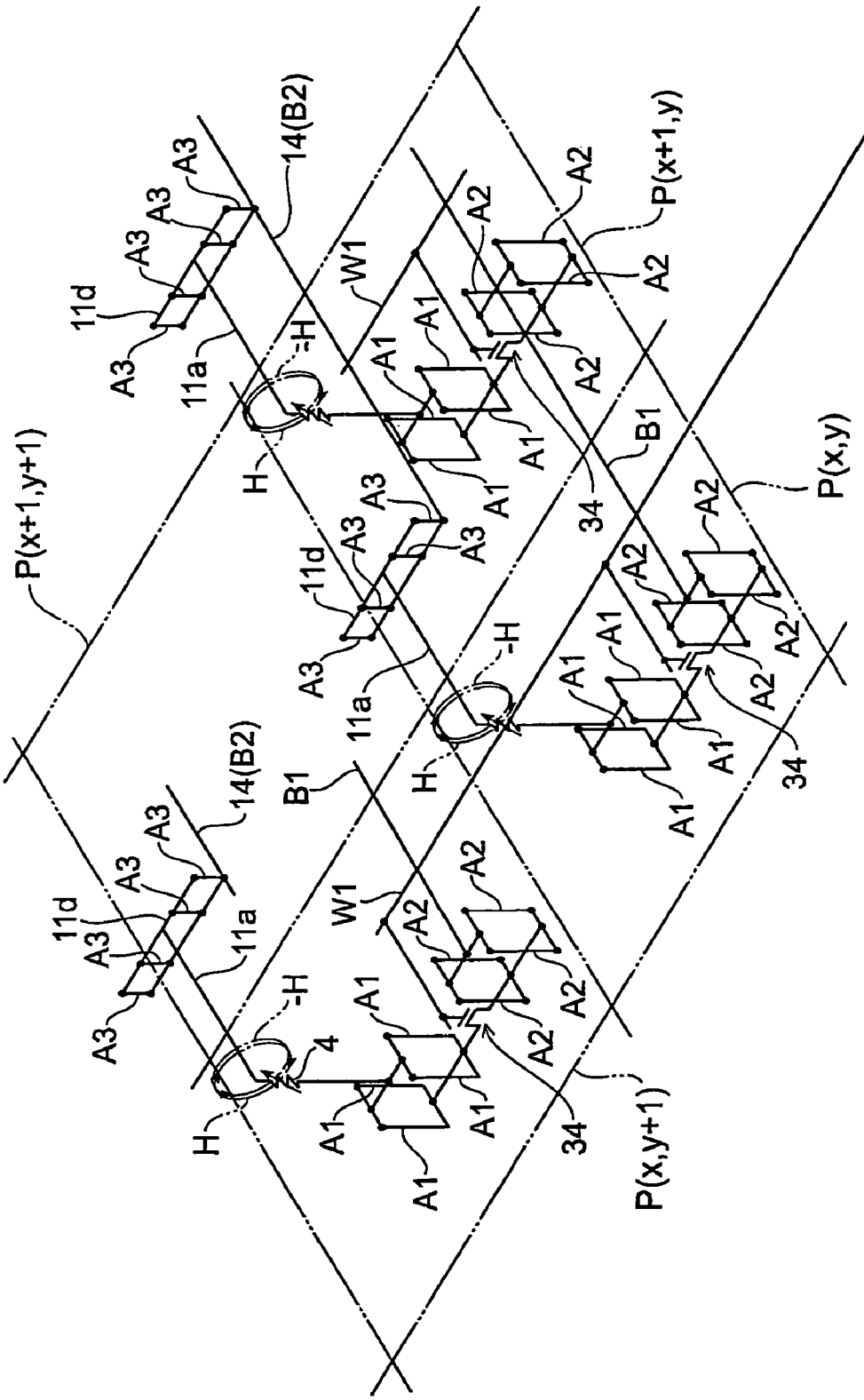
FIG. 19 is a circuit diagram showing an electrical connection relationship in the magnetic memory shown in FIG. 18.
Figure 20:
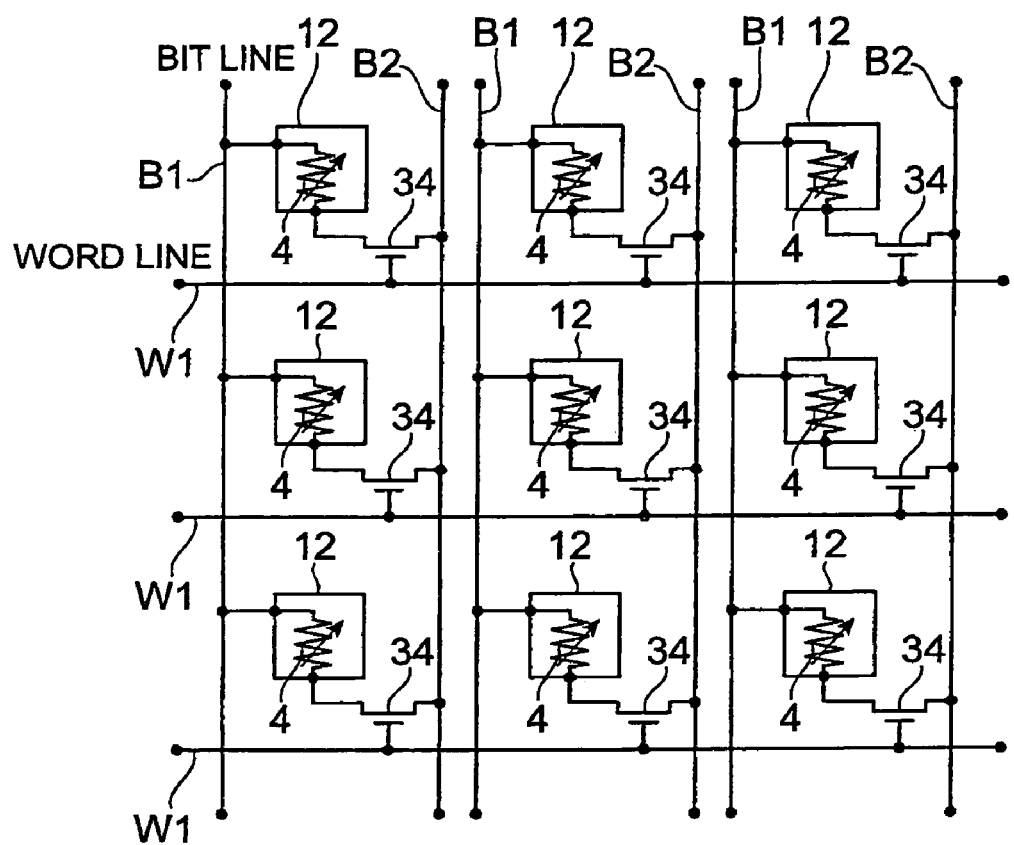
FIG. 20 is a circuit diagram showing a simplified version of the connection relationship shown in FIG. 19.

FIG. 19 is a circuit diagram showing an electrical connection relationship in the magnetic memory shown in FIG. 18. FIG. 20 is a circuit diagram showing a simplified version of the connection relationship shown in FIG. 19.

When reading out information, the potential of the bit line B1 is set higher than the reference potential GND provided by the bit line B2, the transistor 34 is turned ON, and read current (resistance) flowing through the magneto-resistance effect element 4 at this moment is measured. In the case in which the magnetization directions of the free layer and the fixed layer in the magneto-resistance effect element 4 are parallel to each other and the magnetic resistance is low, "0," for example, is set, and in the case in which the magnetization directions of both layers are antiparallel and the magnetic resistance is high, "1," for example, is set. In this manner, the first wiring 11a is in contact with the magneto-resistance effect element 4, whereby the read current can be caused to flow.

When writing the information, and when writing, for example, "0," the potential of the bit line B1 is set higher than the reference potential GND provided by the bit line B2, the transistor 34 is turned ON, and the magnetic field H, which is generated by the current flowing through the first wiring 11a so as to surround the direction of travel of the current (y direction) in a predetermined section, passes through the inside of the magnetic yoke 12 and is then applied to the free layer 44 of the magneto-resistance effect element 4 (see FIG. 2). Accordingly, the magnetization direction within the free layer 44 changes so that it conforms to the applied magnetic field, whereby "0" is written. The magnetization directions of the fixed layers 41, 42 are perpendicular to the direction in which the first wiring 11a extends and to the thickness direction of the magneto-resistance effect element 4 (x direction).

When writing the information, and when writing, for example, "1," the potential of the bit line B1 is set lower than the reference potential GND of the bit line B2, the transistor 34 is turned ON, and the magnetic field (—H), which is generated by the current flowing through the first wiring 11a so as to surround the direction of travel of the current in a direction opposite to the predetermined direction, passes through the inside of the magnetic yoke 12 and is then applied to the free layer of the magneto-resistance effect element 4. Accordingly, the magnetization direction within the free layer changes so that it conforms to the applied magnetic field, whereby "1" is written.

Figure 21:
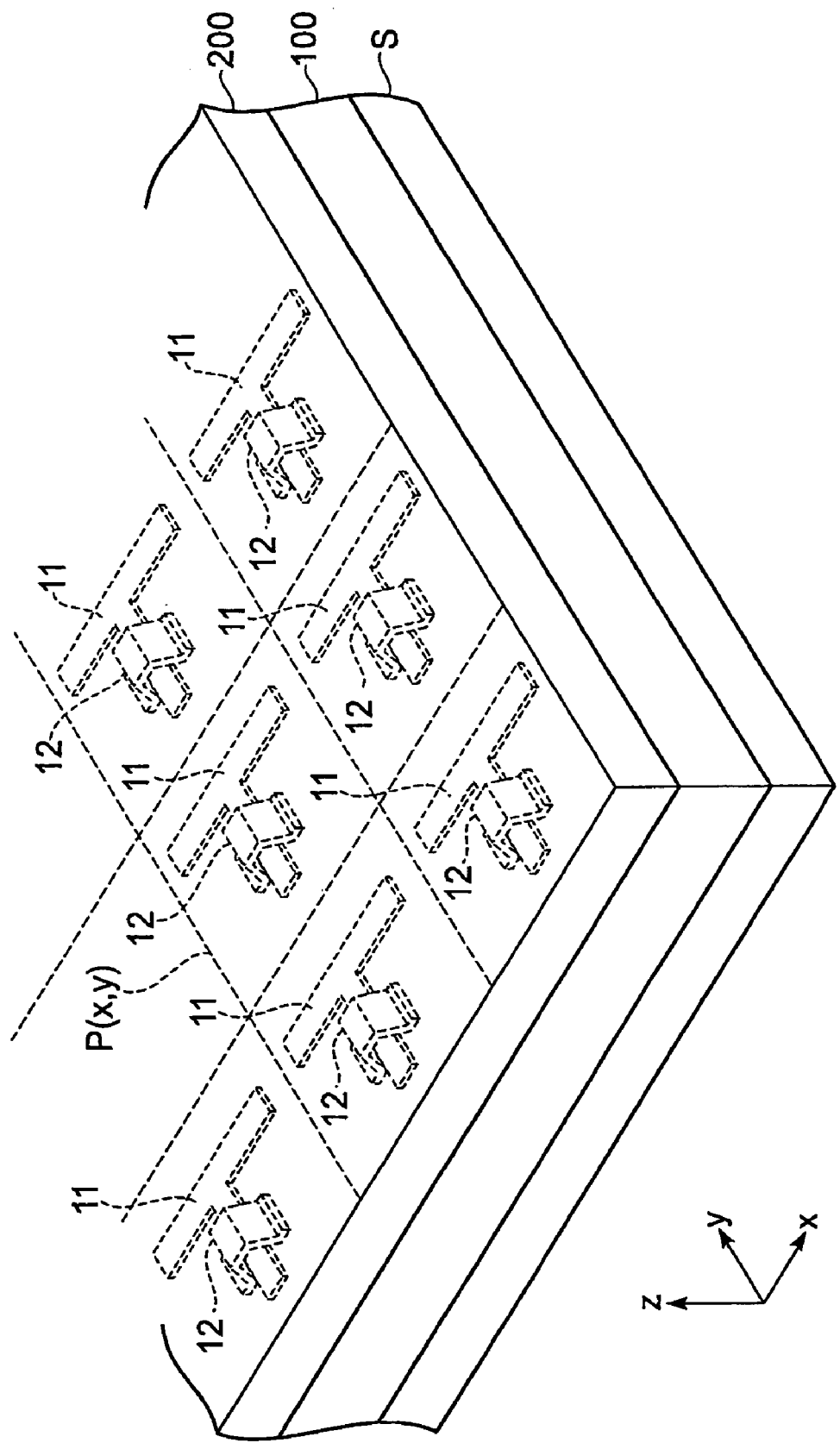
FIG. 21 is a perspective view of the magnetic memory.

FIG. 21 is a perspective view of this magnetic memory.

The magnetic memory has the lower insulating layer 100 formed on the semiconductor substrate S, and the upper insulating layer 200, and the magnetic yoke 12 and the wirings 11 in each storage area. P (x, y) are embedded in the upper insulating layer 200. Resin, $SiO_2$, or the like can be used as the material of the upper insulating layer. The transistor 34 shown in FIG. 18 is positioned within an area in which the magnetic yoke 12 is projected in the thickness direction (z direction), and the size of each storage area P (x, y) is reduced extremely small.

Figure 22:
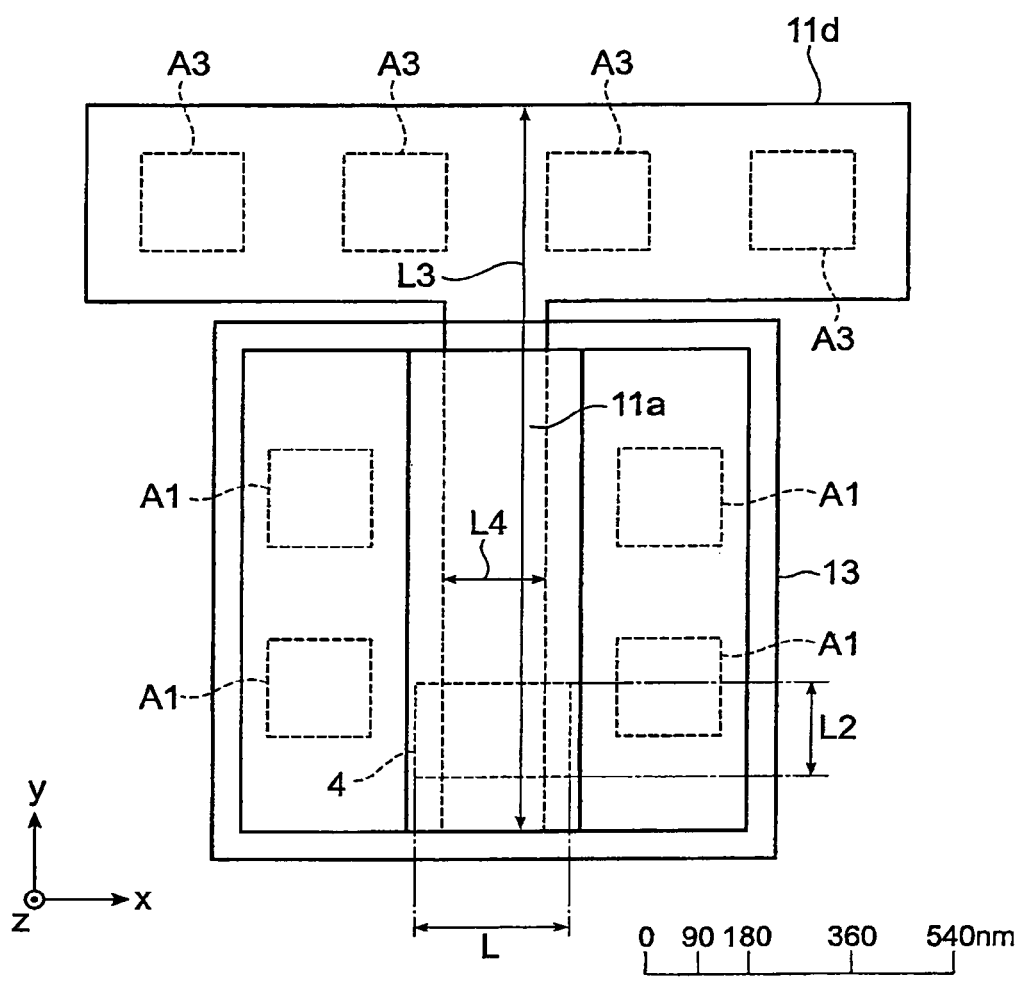
FIG. 22 is a plan view of a single memory element according to the embodiment.

FIG. 22 is a plan view of a single memory element according to the embodiment described above.

The length L of the magneto-resistance effect element 4 in the x direction is 300 nm (0.3 μm), and the length L2 of the same in the y direction is 200 nm. The lengths of each vertical wiring A1 and each reference penetrating wiring A3 in the x direction are 180 nm, and the lengths of the same in the y direction are 180 nm. Also, L3=1250 nm and L4=170 nm. In this element, Iw can be set to 2.0 mA.

Furthermore, as shown in FIG. 17, in the case in which only one wiring 11 is provided within the magnetic yoke 12, this wiring 11 further has the extended wiring 11d, which continues to one end of the first wiring 11a and is connected to the reference wiring 14 providing the reference potential GND, and a plurality of reference penetrating wirings A3 that connect the extended wiring 11d and the reference wiring 14 to each other along the thickness direction of the magneto-resistance effect element 4 (z direction), wherein the first wiring 11a and the extended wiring 11d may be formed in a U shape.

Figure 23:
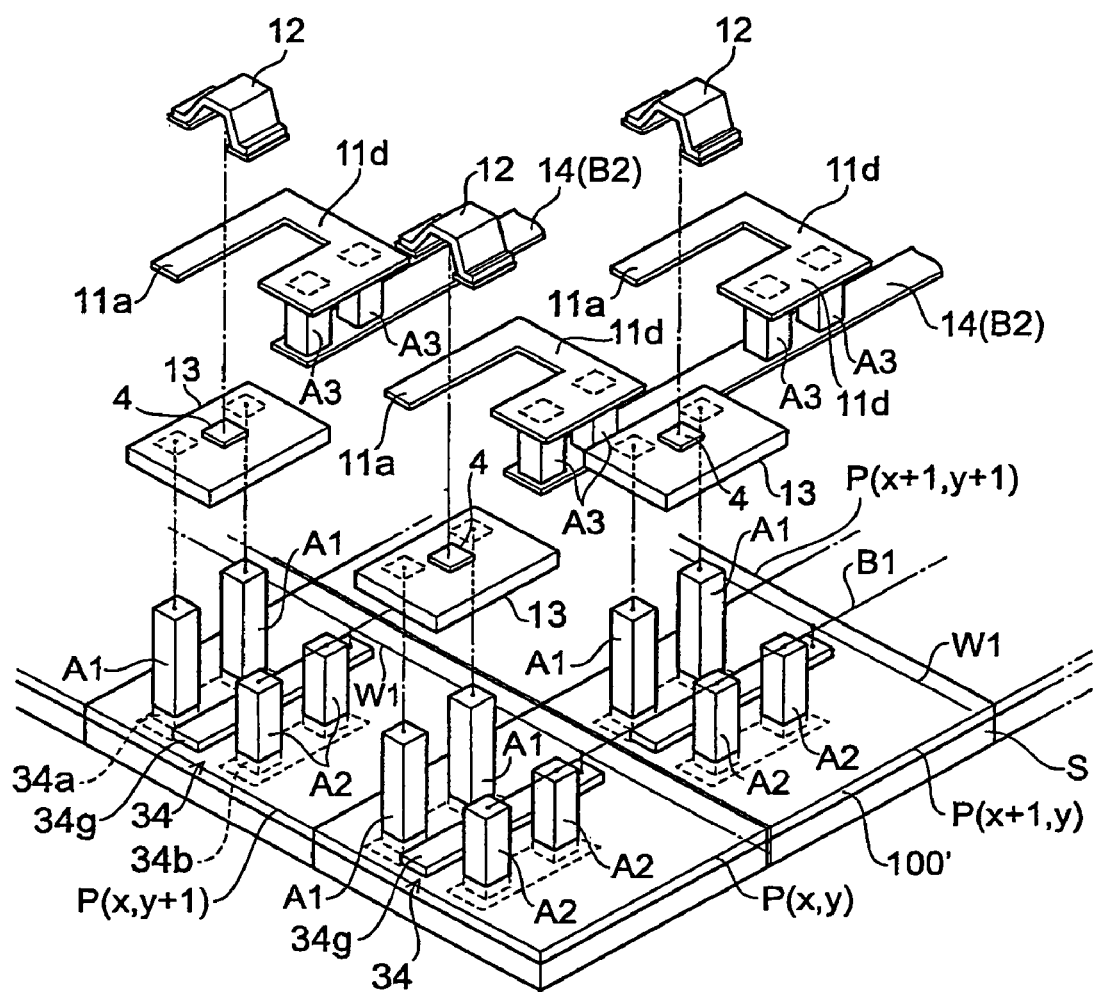
FIG. 23 is an exploded perspective view of the magnetic memory.

FIG. 23 is an exploded perspective view of this magnetic memory in the case described above. The plurality of storage areas P (x, y), P (x+1, y), P (x, y+1), and P (x+1, y+1) having the same structure are arranged two-dimensionally. The plurality of reference penetrating wirings A3 extend from the extended wiring 11d to the reference wiring 14 (bit line B2). It is necessary to increase the total area of the reference penetrating wirings A3 through which the current passes, in order to supply more current, and in this case the area of the extended wiring 11d needs to be increased. When the first wiring 11a and the extended wiring 11d are in the shape of T, the extended wiring 11d extends perpendicular to the first wiring 11a, and when they are in the shape of U, the majority of the extended wiring and first wiring extend parallel. Specifically, when increasing the area of the extended wiring 11d, the length of the extended wiring 11d is increased, but the first wiring 11a and the extended wiring 11d can be contained in a small space if the extended wiring 11d extends parallel to the first wiring 11a, thus a small storage area P (x, y) can be realized.

Figure 24:
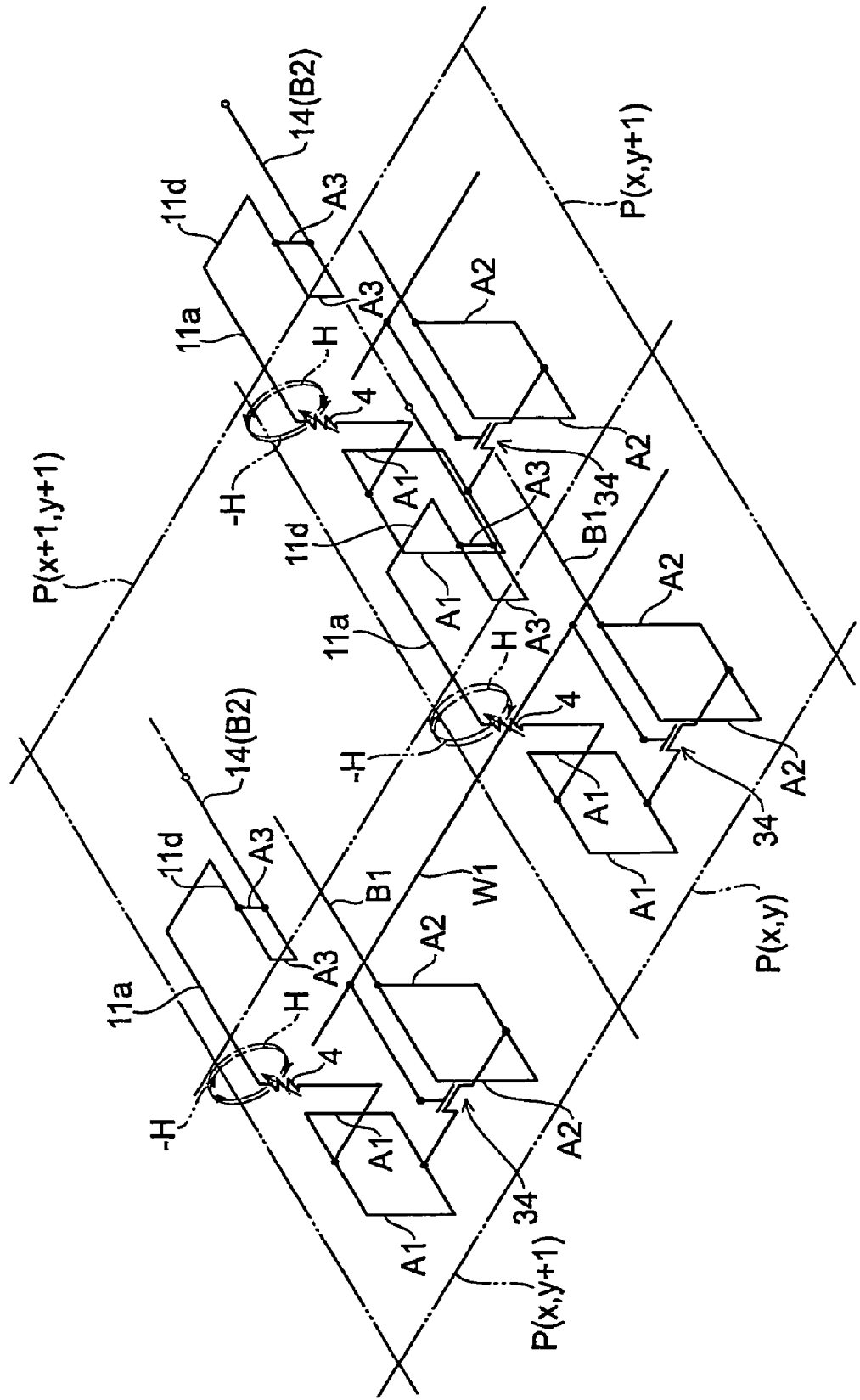
FIG. 24 is a circuit diagram showing an electrical connection relationship in the magnetic memory shown in FIG. 23.

FIG. 24 is a circuit diagram showing an electrical connection relationship in the magnetic memory shown in FIG. 23, and a circuit diagram showing a simplified version of this connection relationship is the same as the one shown in FIG. 20. The information reading method and the information writing method are the same as those shown in FIG. 19 and FIG. 20. Furthermore, the number of reference penetrating wirings A3 connected to the bit line B2 in each storage area P (x, y) is two.

It should be noted in the above-described example that the storage areas P (x, y) and P (x+1, y) adjacent to each other in the x direction are connected to the common bit line B2.

Figure 25:
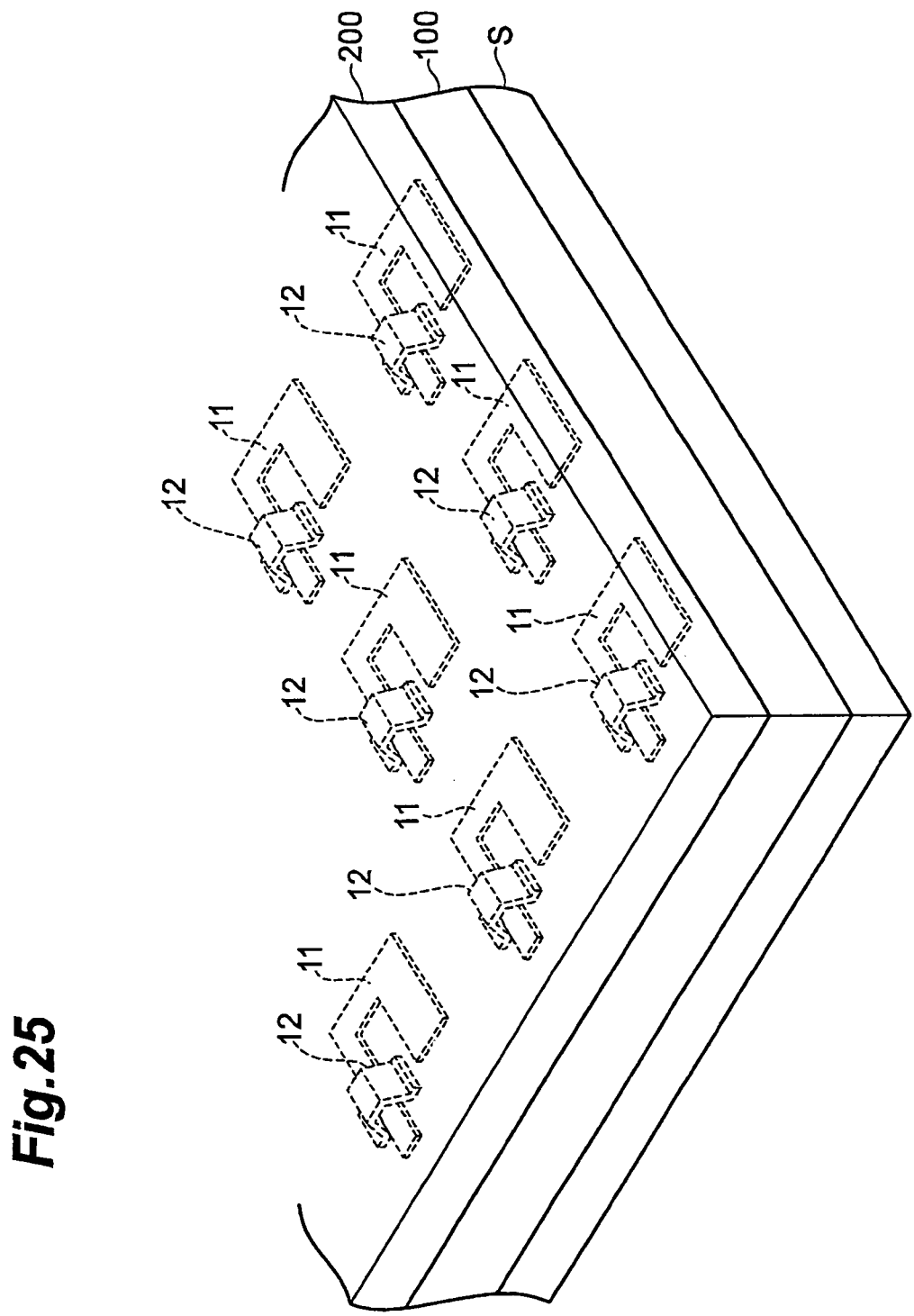
FIG. 25 is a perspective view of the magnetic memory.

FIG. 25 is a perspective view of the magnetic memory.

This magnetic memory has the lower insulating layer 100 formed on the semiconductor substrate S, and the upper insulating layer 200, and the magnetic yoke 12 and the wirings 11 in each storage area P (x, y) are embedded in the upper insulating layer 200. Resin, $SiO_2$, or the like can be used as the material of the upper insulating layer. The transistor 34 shown in FIG. 23 and FIG. 24 is positioned within an area in which the magnetic yoke 12 is projected in the thickness direction (z direction), and the size of each storage area P (x, y) is reduced extremely small.

Figure 26:
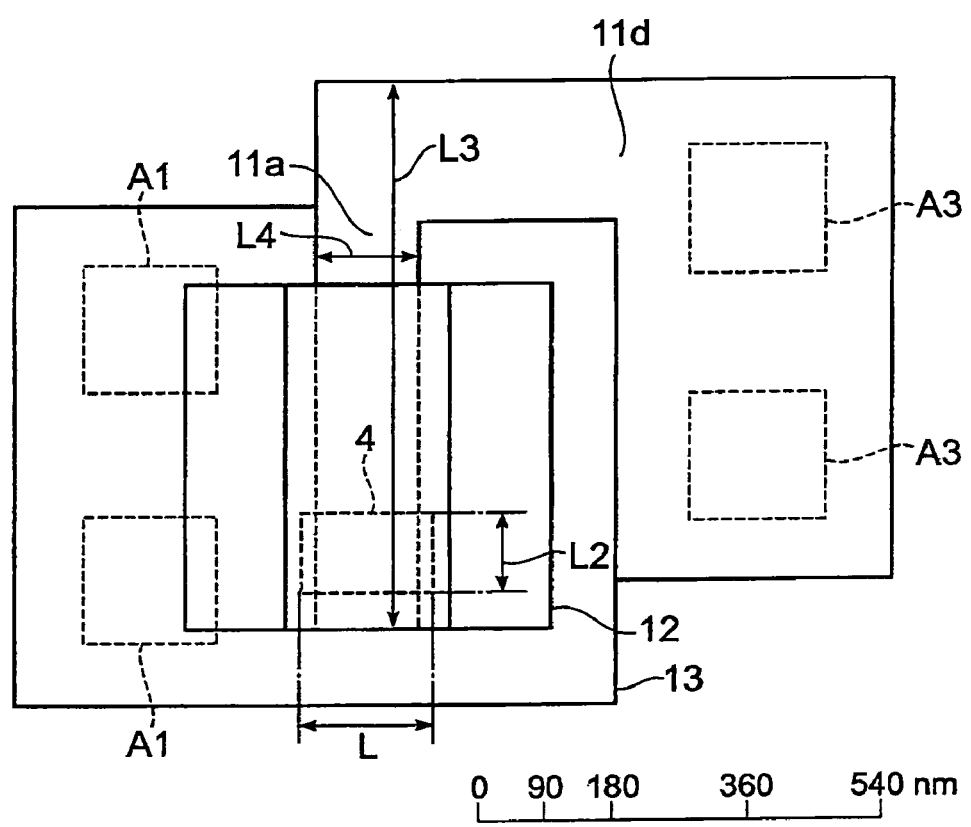
FIG. 26 is a plan view of a single memory element according to the embodiment.

FIG. 26 is a plan view of a single memory element according to the embodiment described above.

The length L of the magneto-resistance effect element 4 in the x direction is 180 nm (0.18 μm), and the length L2 of the same in the y direction is 90 nm. The lengths of each vertical wiring A1 and each reference penetrating wiring A3 in the x direction are 180 nm, and the lengths of the same in the y direction are 180 nm. Also, L3=770 nm and L4=135 nm. In this element, Iw can be set to 1.0 mA.

Next, a method of manufacturing the above-described magnetic sensor shown in FIG. 9 is described. Other magnetic sensor manufacturing methods are the same as the following method, except that the number of vertical electrodes and the number of reference penetrating electrodes are different.

Figure 27A:
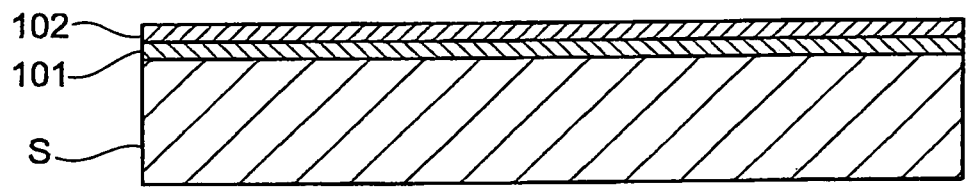
FIG. 27A and FIG. 27B are diagrams for explaining a method of manufacturing the magnetic memory.

First, a P-type silicon substrate S is prepared, and a $SiO_2$ film 101 and a $Si_3N_4$ film 102 are formed successively on the substrate by means of a spattering method or a CVD method (FIG. 27A). For example, the $Si_3N_4$ film can be formed using SiH and $NH_3$.

Figure 27B:
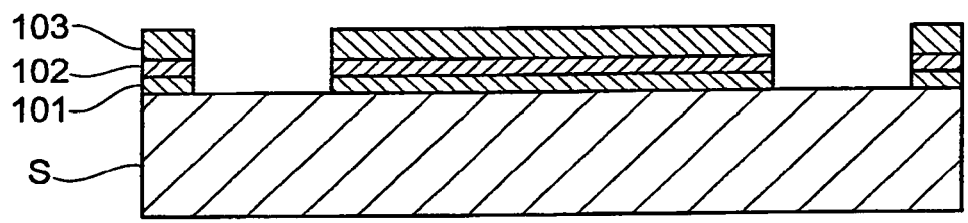

Next, a photoresist 103 is applied onto the $Si_3N_4$ film 102, patterning is performed so that a periphery of an area to be formed with the transistor is opened, and thus obtained matter is taken as a mask to perform dry etching until the surface of the semiconductor substrate S is exposed (FIG. 27B).

Figure 28A:
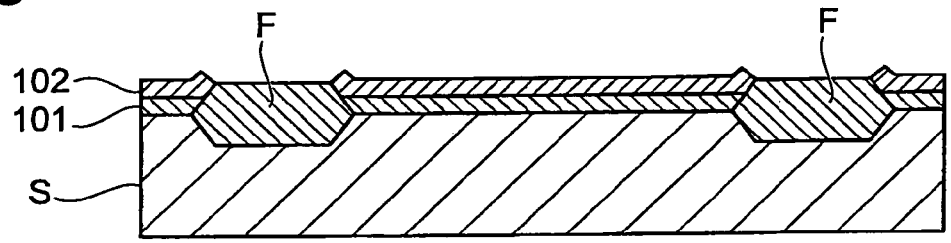
FIG. 28A, FIG. 28B, FIG. 28C and FIG. 28D are diagrams for explaining the method of manufacturing the magnetic memory.

Next, after the photoresist is removed, the substrate is thermally oxidized to thereby form the field oxide film F made of $SiO_2$ within the opening of the insulating films 101, 102, and an active region (LOCOS) is formed (FIG. 28A).

Figure 28B:
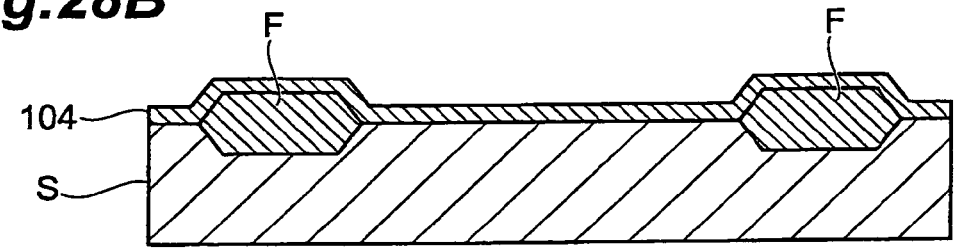

Next, the $SiO_2$ film 101 and the $Si_3N_4$ film 102 are removed by wet etching, and a gate oxide film 104 is formed by thermal oxidization (FIG. 28B).

Figure 28C:
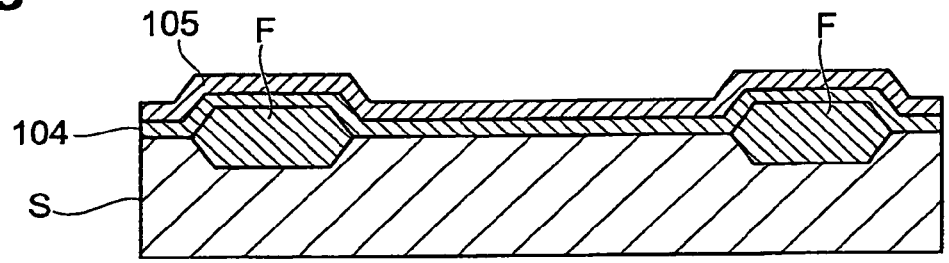

Next, a polysilicon film 105 is formed on the gate oxide film 104 by means of the spattering method (FIG. 28C). The polysilicon 105 may be formed using, for example, SiH and $N_2$ by means of thermal CVD.

Figure 28D:
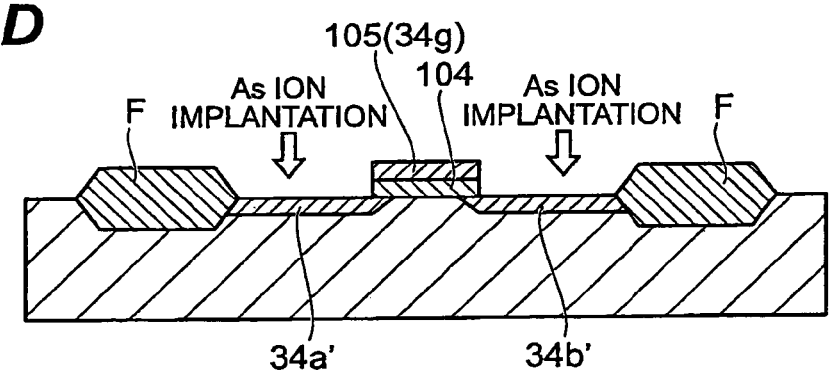

Next, patterning is performed on the polysilicon film 105 by means of the photoresist so that the gate electrode 34g remains in a predetermined section on the gate oxide film 104, and subsequently the exposed gate oxide film 104 is removed by performing dry etching by means of RIE or the like. Reactive ion etching (RIE) can be used in the etching when performing the patterning. Thereafter, the gate electrode 105 (34g) is taken as a mask, and As ion is implanted into the semiconductor substrate S in a self-aligning manner to form an N-type drain region 34a' and source region 34b' having high impurity concentration (FIG. 28D).

Figure 29A:
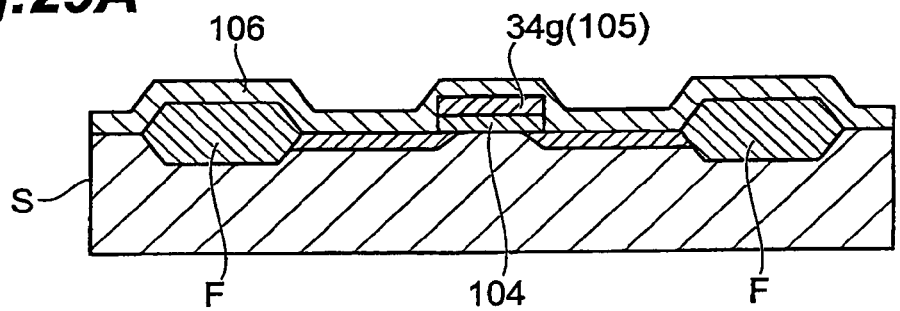
FIG. 29A, FIG. 29B, FIG. 29C and FIG. 29D are diagrams for explaining the method of manufacturing the magnetic memory.

Next, an interlayer insulating film 106 composed of $SiO_2$ is formed on the surface of the substrate by means of the spattering method or the like (FIG. 29A). The interlayer insulating film 106 may be formed using SiH and $O_2$ by means of the CVD method in place of the spattering method.

Figure 29B:
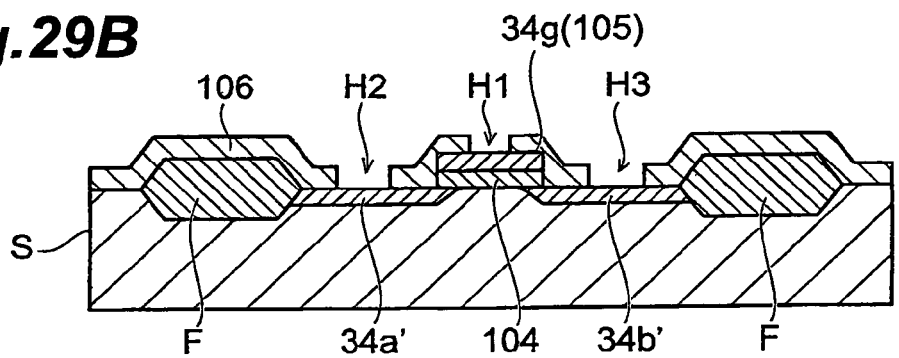
Figure 29C:
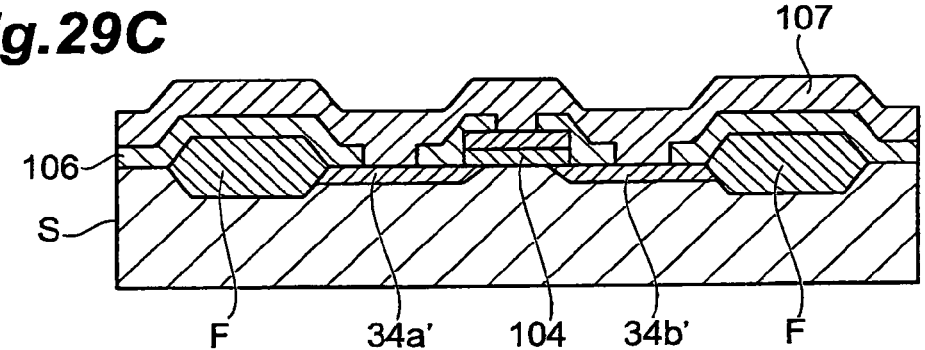

A contact hole H1 is formed on the interlayer insulating film 106 formed on the gate electrode 34g (105), a contact hole H2 on the interlayer insulating film 106 formed on the drain region 34a', and a contact hole 13 on the interlayer insulating film 106 formed on the source region 34b' (FIG. 29B). Subsequently, a metal layer (Al) 107 is formed on the interlayer insulating film 106 (FIG. 29C). It should be noted that the gate electrode 34g itself may be taken as the word line W1 without forming a contact hole for the gate electrode.

Figure 29D:
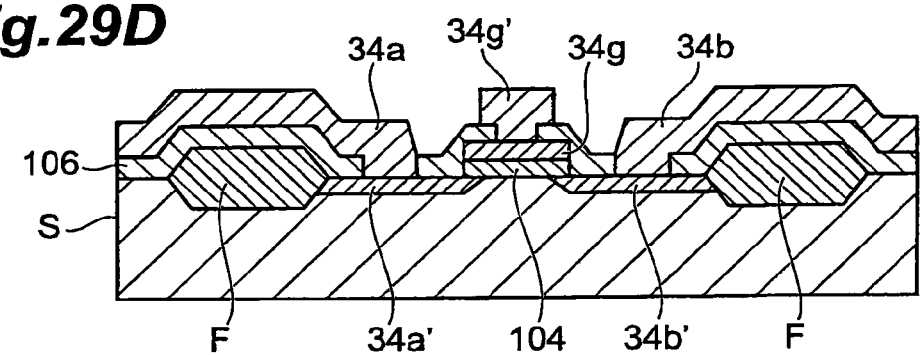

Furthermore, the metal layer 107 is patterned to form the drain electrode 34a, source electrode 34b, and gate electrode 34g' (FIG. 29D).

Figure 30A:
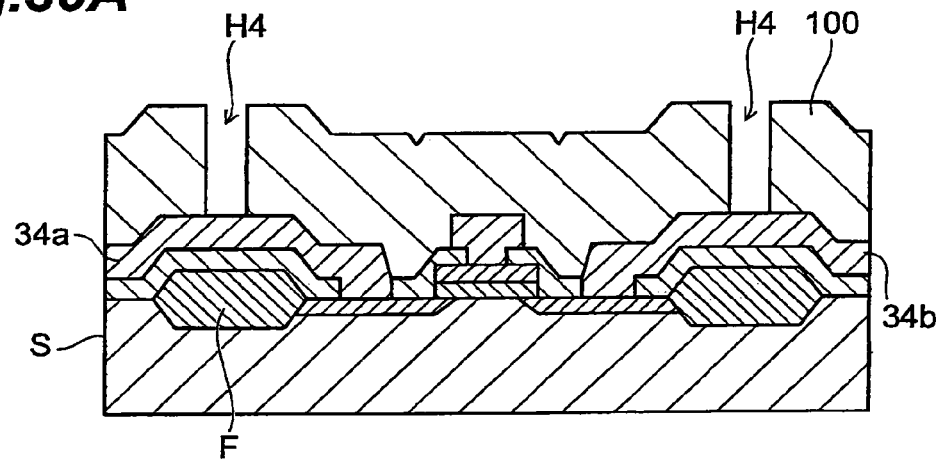
FIG. 30A, FIG. 30B and FIG. 30C are diagrams for explaining the method of manufacturing the magnetic memory.
Figure 30B:
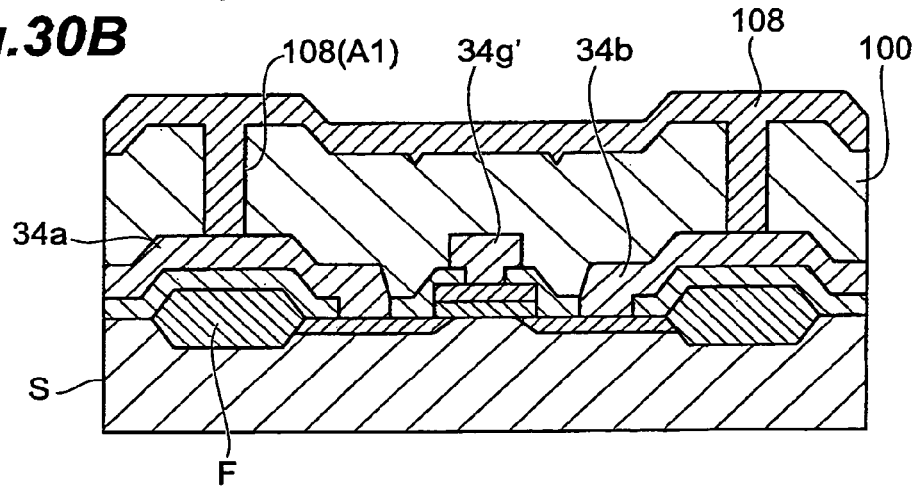

Next, the lower insulating layer 100 is deposited on the substrate S to form a through-hole H4 extending from the surface of the substrate to reach the drain electrode 34a and the source electrode 34b (FIG. 30A), and a metal layer (W: tungsten) 108 is deposited thereon. The metal layer 108 extends toward the drain electrode 34a and the source electrode 34b through the inside of the through-hole H4 (FIG. 30B).

Figure 30C:
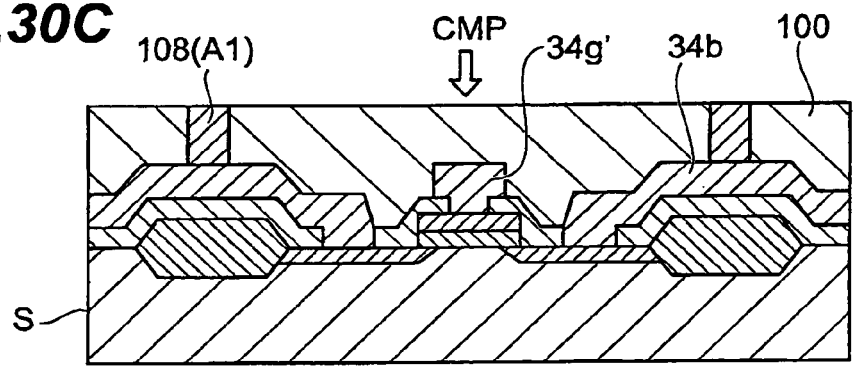

Next, chemical mechanical polishing (CMP) is performed from a surface of the metal layer 108 to the deep part thereof until the lower insulating layer 100 becomes flat, and the metal layer 108 is removed, leaving the metallic material 108 within the through-hole H4 (FIG. 30C).

Figure 31A:
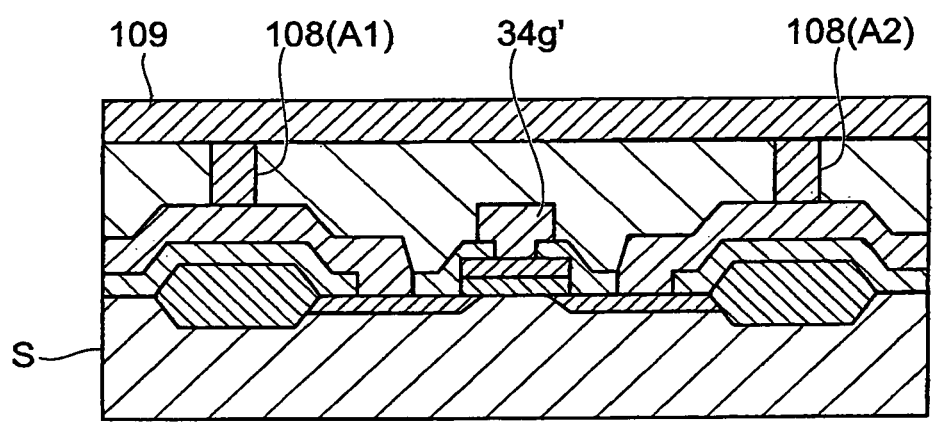
FIG. 31A and FIG. 31B are diagrams for explaining the method of manufacturing the magnetic memory.
Figure 31B:
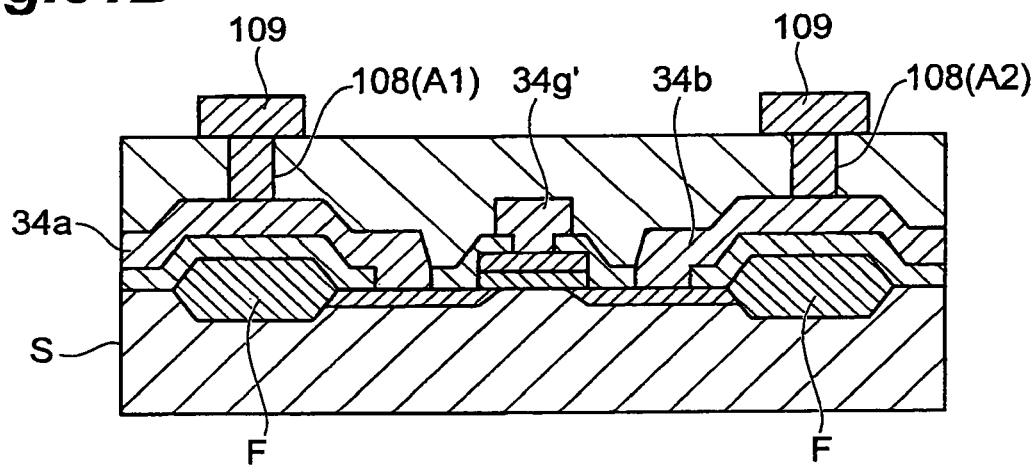
Figure 32A:
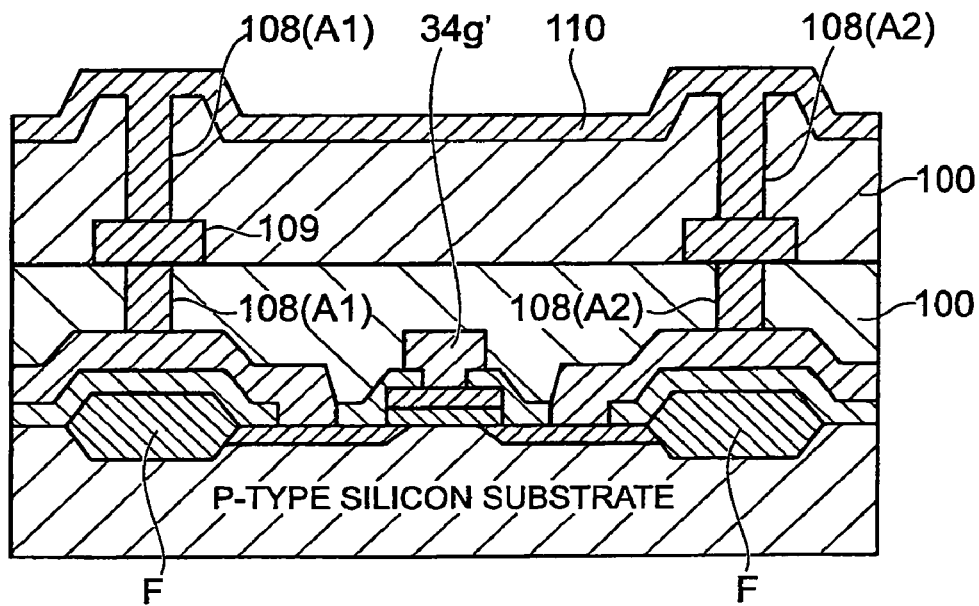
FIG. 32A and FIG. 32B are diagrams for explaining the method of manufacturing the magnetic memory.
Figure 32B:
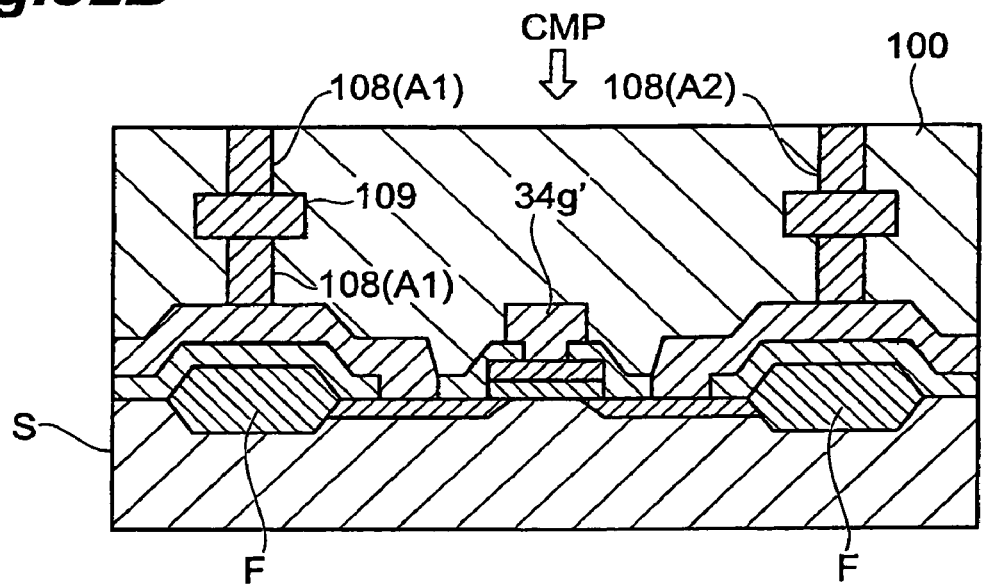

Next, a wiring 109 extending in a horizontal direction is formed on the lower insulating layer 100 (FIG. 31A), and etching is performed, leaving the sections of the vertical wirings A1, A2 (FIG. 31B). The wiring can be formed using A1 or the like. The processes from FIG. 30A through FIG. 31B are repeated in order to stretch the lengths of the vertical wirings A1, A2 in a vertical direction, and an electrode layer 110 composed of W is formed on the surface of the insulating layer 100 of $SiO_2$, which is formed last time (FIG. 32A). This last formed insulating layer 100 is subjected to chemical mechanical polishing (CMP) (FIG. 32B).

After forming the vertical wirings A1, A2, the lower electrode 13 is formed on the top surface of the vertical wiring A1, thereafter the TMR element 4 is formed on the lower electrode 13, and the abovementioned first wiring 11a, connection wiring 11b, second wiring 11c and extended wiring 11d are patterned thereon to form the upper insulating layer 200, whereby the magnetic memory having the above-described structure is completed. It should be noted that the upper insulating layer 200 is formed in several steps, and the bit line B2 is formed in mid-course of these steps. The reference penetrating wiring A3 is formed on the bit line B2 using the same method as the abovementioned method of forming the vertical wiring, and the extended wiring 11d is patterned on an upper surface of the reference penetrating wiring A3. The length of the vertical wiring A2 may be set shorter than the length of the vertical wiring A1 as in the above-described embodiment.

As described above, in the abovementioned magnetic memory, even if the element size is equal to or smaller than 0.7 μm, the amount of write current required to invert the magnetization of the free layer can be reduced as the element size decreases. Since the magnetic memory can be operated even with weak write current, it is not necessary to provide a large-area transistor in addition to the transistor for reading.

Therefore, it is only necessary to adopt only one transistor 34 for read/write control in each storage area P (x, y), so that high integration can be achieved.

Since each storage area has one transistor 34, a write margin can be increased. Furthermore, since the transistor 34 is configured for writing and reading, the memory element size can be reduced, whereby a large capacity memory can be produced. Although a MOS-type transistor is adopted as the abovementioned transistor 34, the transistor 34 can be a bipolar transistor.

Moreover, in the case in which one transistor 34 is used and MgO is used as the intermediate nonmagnetic layer, an output of at least 100 mV can be obtained when the resistance R is 1 KΩ through 5 KΩ. In addition, in the case in which the intermediate nonmagnetic layer is composed of AlOx, the output is approximately 40 mV. Since only one transistor is used, the dimension of each storage area is reduced by half.

The present device can be utilized in a magnetic memory.

What is claimed is:

1. A magnetic memory, which is configured by disposing therein a plurality of storage areas having magneto-resistance effect elements, wherein each of the magneto-resistance effect elements has an element size of 0.7 μm or smaller, the element being taken in a direction of an easy magnetization axis of the magneto-resistance effect element, and comprises:
   a free layer composed of a ferromagnetic body;
   a fixed layer composed of a ferromagnetic body; and
   an intermediate nonmagnetic layer interposed between the free layer and the fixed layer,
   each of the storage areas has:
   switch means for read/write control, which is electrically connected to either one of the fixed layer and the free layer of the each magneto-resistance effect element;
   a wiring that is electrically connected to the other one of the fixed layer and the free layer of the each magneto-resistance effect element; and
   a magnetic yoke that surrounds the wiring and applies a magnetic field to the free layer,
   and
   the number of the switch means within the each storage area is one.

2. The magnetic memory according to claim 1, wherein the intermediate nonmagnetic layer of the each magneto-resistance effect element is composed of an insulation body, and the following relational expression is satisfied between an element size L and a resistance value R of the magneto-resistance effect element that is obtained when magnetization directions of the fixed layer and the free layer are parallel to each other:

$$L \leq -0.3 \times \ln(R) + 3.$$

3. The magnetic memory according to claim 1, wherein the switch means is a transistor.

4. The magnetic memory according to claim 1, wherein the wiring comprises:
   a first wiring, which is connected at one end thereof to the other one of the fixed layer and the free layer and extends in one direction;
   a second wiring, which extends parallel to the first wiring on the inside of the magnetic yoke and is connected at one end thereof to a reference potential; and
   a connection wiring that detours around the outside of the magnetic yoke to electrically connect the other end of the first wiring to the other end of the second wiring.

5. The magnetic memory according to claim 4, wherein the first wiring, the connection wiring, and the second wiring are continuous in a spiral manner around a straight line that is parallel to a thickness direction of the magneto-resistance effect element.

6. The magnetic memory according to claim 5, wherein the wiring further comprises an extended wiring that continues to the one end of the second wiring and is connected to a reference wiring providing the reference potential,
   wherein directions of rotation of the first wiring, the connection wiring and the second wiring that continuously extends in a spiral manner are opposite to directions of rotation of the second wiring and the extended wiring.

7. The magnetic memory according to claim 1, wherein the wiring comprises a first wiring that is electrically connected at one end thereof to the other one of the fixed layer and the free layer, extends in one direction, and is connected at the other end thereof to a reference potential.

8. The magnetic memory according to claim 7, wherein the wiring further comprises:
   an extended wiring that continues to the one end of the first wiring and is connected to a reference wiring providing the reference potential; and
   a reference penetrating wiring that connects the extended wiring and the reference wiring to each other along the thickness direction of the magneto-resistance effect element, and wherein
   the first wiring and the extended wiring are formed in a T or L shape.

9. The magnetic memory according to claim 7, wherein the wiring further comprises:
   an extended wiring that continues to the one end of the first wiring and is connected to a reference wiring providing the reference potential; and
   the reference penetrating wiring that connects the extended wiring and the reference wiring to each other along the thickness direction of the magneto-resistance effect element, and wherein
   the first wiring and the extended wiring are formed in a U shape.

10. The magnetic memory according to claim 1, wherein the each storage area has a vertical wiring for connecting the switch means to the magneto-resistance effect element along the thickness direction of the magneto-resistance effect element, and wherein the vertical wiring is provided in a plurality.

* * * * *